United States Patent
Lee et al.

(10) Patent No.: US 12,550,520 B2
(45) Date of Patent: Feb. 10, 2026

(54) METHOD OF PREPARING QUANTUM DOTS, QUANTUM DOT PREPARED BY THE METHOD OF PREPARING QUANTUM DOT, OPTICAL MEMBER INCLUDING THE QUANTUM DOT, AND ELECTRONIC APPARATUS INCLUDING THE QUANTUM DOT

(71) Applicants: Samsung Display Co., Ltd., Yongin-si (KR); Research & Business Foundation Sungkyunkwan University, Suwon-si (KR)

(72) Inventors: Sooho Lee, Yongin-si (KR); Sungwoon Kim, Yongin-si (KR); Jaehoon Lim, Suwon-si (KR); Yeongho Choi, Suwon-si (KR)

(73) Assignees: Samsung Display Co., Ltd., Yongin-si (KR); Research & Business Foundation Sungkyunkwan University, Suwon-si (KR)

( * ) Notice: Subject to any disclaimer, the term of this patent is extended or adjusted under 35 U.S.C. 154(b) by 801 days.

(21) Appl. No.: 17/738,569

(22) Filed: May 6, 2022

(65) Prior Publication Data

US 2022/0384752 A1 Dec. 1, 2022

(30) Foreign Application Priority Data

May 11, 2021 (KR) .................. KR10-2021-0060809

(51) Int. Cl.
*H10K 50/115* (2023.01)
*G02B 1/00* (2006.01)
(Continued)

(52) U.S. Cl.
CPC ........... *H10K 50/115* (2023.02); *G02B 1/002* (2013.01); *G02B 5/206* (2013.01); *G02B 5/207* (2013.01);
(Continued)

(58) Field of Classification Search
CPC .... H10K 50/115; H10K 59/38; H10K 85/321; H10K 85/381; G02B 1/002; G02B 5/206; G02B 5/207
See application file for complete search history.

(56) References Cited

U.S. PATENT DOCUMENTS 7,621,997 B2    11/2009    Jun et al.
7,700,200 B2    4/2010    Bulovic et al.
(Continued)

FOREIGN PATENT DOCUMENTS

CN            111662715 A      9/2020
KR    10-2007-0029915 A      3/2007
(Continued)

OTHER PUBLICATIONS

Donghyo Hahm et al., Design Principle for Bright, Robust, and Color-Pure InP/ZnSe$_x$S$_{1-x}$/ZnS Heterostructures, Chemistry of Materials, 2019, pp. 3476-3484, vol. 31, ACS Publications.

(Continued)

*Primary Examiner* — Brook Kebede
(74) *Attorney, Agent, or Firm* — Womble Bond Dickinson (US) LLP

(57) ABSTRACT

Provided are a method of preparing quantum dots, a quantum dot prepared by the method, an optical member including the quantum dot, and an electronic apparatus including the quantum dot. The method includes: preparing a mixture of a semiconductor compound including indium (In), a first precursor including a first metal element, a second precursor including a second metal element, a third precursor includ- (Continued)

ing a third element, and a fourth precursor including a fourth element; and heating the mixture, wherein the first precursor and the second precursor are different from each other, and the third precursor and the fourth precursor are different from each other.

18 Claims, 5 Drawing Sheets

(51) Int. Cl.
  *G02B 5/20* (2006.01)
  *H10K 85/30* (2023.01)
  *B82Y 20/00* (2011.01)
  *B82Y 40/00* (2011.01)
  *H10K 59/38* (2023.01)

(52) U.S. Cl.
  CPC ......... *H10K 85/321* (2023.02); *H10K 85/381* (2023.02); *B82Y 20/00* (2013.01); *B82Y 40/00* (2013.01); *G02B 2207/101* (2013.01); *H10K 59/38* (2023.02)

(56) References Cited

U.S. PATENT DOCUMENTS

| | | | |
|---|---|---|---|
| 10,711,193 B2 | 7/2020 | Kim et al. | |
| 2014/0264258 A1* | 9/2014 | Shim | B82Y 10/00 257/14 |
| 2018/0033856 A1* | 2/2018 | Kwon | C09K 11/70 |
| 2019/0229153 A1* | 7/2019 | Park | H10K 59/38 |
| 2019/0378959 A1 | 12/2019 | Won et al. | |
| 2020/0291295 A1* | 9/2020 | Kahen | C09K 11/025 |

FOREIGN PATENT DOCUMENTS

| | | |
|---|---|---|
| KR | 10-2018-0088552 A | 8/2018 |
| KR | 10-2019-0060753 A | 6/2019 |
| KR | 10-2019-0065177 | 6/2019 |
| KR | 10-2184319 B1 | 11/2020 |

OTHER PUBLICATIONS

Jaehoon Lim et al., InP@ZnSeS, Core@Composition Gradient Shell Quantum Dots with Enhanced Stability, Chemistry of Materials, 2011, pp. 4459-4463, vol. 23, ACS Publications.

Sungjun Koh et al., Zinc-Phosphorus Complex Working as an Atomic Valve for Colloidal Growth of Monodisperse Indium Phosphide Quantum Dots, Chemistry of Materials, 2017, pp. 6346-6355, vol. 29, ACS Publications.

Tadao Sugimoto, Preparation of Monodispersed Colloidal Particles, Advances in Colloid and Interface Science, 1987, pp. 65-108, vol. 28, Elsevier Science Publishers B.V., Amsterdam, Netherlands.

Yongwook Kim et al., Bright and Uniform Green Light Emitting InP/ZnSe/ZnS Quantum Dots for Wide Color Gamut Displays, ACS Applied Nano Materials, 2019, pp. 1496-1504, vol. 2, ACS Publications.

Chinese Office Action for CN Application 202210322984.X, dated Jun. 13, 2025, 7 pages.

\* cited by examiner

METHOD OF PREPARING QUANTUM DOTS, QUANTUM DOT PREPARED BY THE METHOD OF PREPARING QUANTUM DOT, OPTICAL MEMBER INCLUDING THE QUANTUM DOT, AND ELECTRONIC APPARATUS INCLUDING THE QUANTUM DOT

CROSS-REFERENCE TO RELATED APPLICATION

This application claims priority to and the benefit of Korean Patent Application No. 10-2021-0060809, filed on May 11, 2021, in the Korean Intellectual Property Office, the disclosure of which is incorporated by reference herein in its entirety.

BACKGROUND

1. Field

One or more embodiments relate to a method of preparing quantum dots, a quantum dot prepared by the method, an optical member including the quantum dot, and an electronic apparatus including the quantum dot.

2. Description of the Related Art

Quantum dots can be utilized as materials that perform various suitable optical functions (for example, a light conversion function, a light emission function, and/or the like) in optical members and various suitable electronic apparatuses. Quantum dots, which are semiconductor nanocrystals with a quantum confinement effect, may have different energy bandgaps by controlling the size and composition of the nanocrystals, and thus may emit light of various suitable emission wavelengths.

Optical members including such quantum dots may have a thin film form, for example, a thin film patterned according to subpixels. Such optical members may be utilized as a color conversion member of a device including various light sources.

Quantum dots may be utilized for a variety of purposes in various suitable electronic apparatuses. For example, quantum dots may be utilized as emitters. For example, quantum dots may be included in an emission layer of a light-emitting device, which may include a pair of electrodes and the emission layer, and may serve as an emitter.

Currently, to implement high-definition optical members and electronic apparatuses, there is a need for the development of quantum dots that emit blue light having a maximum emission wavelength of 490 nm or less, have high photoluminescence quantum yield (PLQY), and does not include cadmium, which is a toxic element.

SUMMARY

Aspects according to one or more embodiments are directed toward a novel quantum dot preparation method, a quantum dot prepared by the preparation method, an optical member including the quantum dot, and an electronic apparatus including the quantum dot.

Additional aspects will be set forth in part in the description, which follows and, in part, will be apparent from the description, or may be learned by practice of the presented embodiments of the disclosure.

According to one or more embodiments, provided is a method of preparing a quantum dot, the method including
preparing a mixture including a semiconductor compound including indium (In), a first precursor including a first metal element, a second precursor including a second metal element, a third precursor including a third element, and a fourth precursor including a fourth element, and
heating the mixture,
wherein the first precursor and the second precursor are different from each other, and
the third element and the fourth element are different from each other.

According to one or more embodiments, provided is a quantum dot
prepared by the method of preparing the quantum dot, the quantum dot including
a core including the semiconductor compound including indium (In), and
a shell surrounding the core,
wherein the shell includes a first region including the third element and the fourth element, and a second region including the fourth element.

According to one or more embodiments, provided is an optical member including the quantum dot.

According to one or more embodiments, provided is an electronic apparatus including the quantum dot.

BRIEF DESCRIPTION OF THE DRAWINGS

The above and other aspects, features, and enhancements of certain embodiments of the disclosure will be more apparent from the following description taken in conjunction with the accompanying drawings, in which.

DETAILED DESCRIPTION

Figure 1:
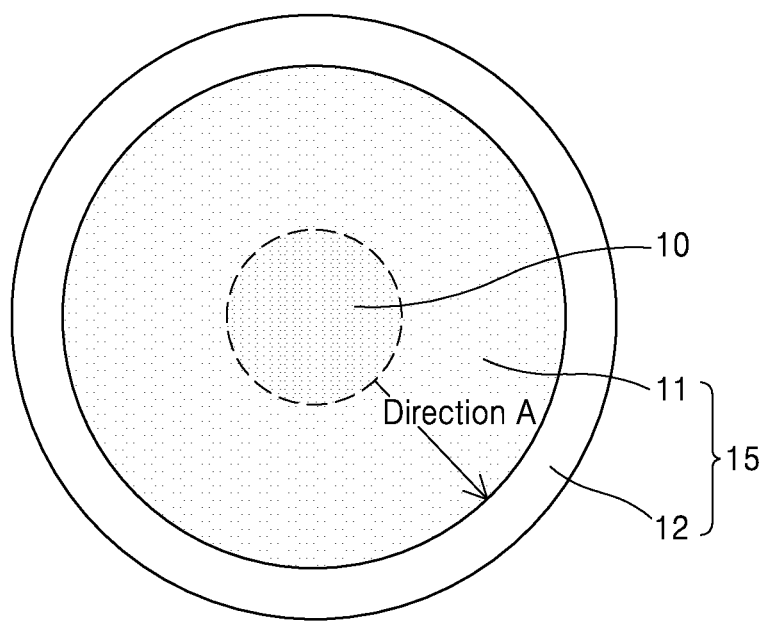
FIG. 1 is a schematic view showing a cross-section of a quantum dot according to an embodiment.

Reference will now be made in more detail to certain embodiments, examples of which are illustrated in the accompanying drawings, wherein like reference numerals refer to like elements throughout the specification. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof.

The disclosure may include various modifications and various embodiments, and specific embodiments will be illustrated in the drawings and described in more detail in the detailed description. Effects and features of the disclosure, and implementation methods therefor will become clear with reference to the embodiments described with reference to the drawings. The disclosure may, however, be embodied in many different forms and should not be construed as limited to the embodiments set forth herein.

It will be understood that although the terms "first," "second," and/or the like used herein may be used to describe various components, these components should not be limited by these terms. These components are only used to distinguish one component from another.

As used herein, the singular forms "a," "an" and "the" are intended to include the plural forms as well, unless the context clearly indicates otherwise.

As used herein, the terms "comprise", "include", "have", and/or the like, specify the presence of stated features, integers, processes, operations, elements, components, and/or combinations thereof but do not preclude the presence or addition of one or more other features, integers, processes, operations, elements, components, and/or combinations thereof. For example, the terms "comprise", "include", "have", and/or the like, unless specified otherwise, may refer to both a case of consisting of only the features or components described in the specification and a case of further including other components.

The term "Group II" as used herein may include Group IIA elements and Group IIB elements of the IUPAC periodic table, and the Group II element may include, for example, magnesium (Mg), calcium (Ca), zinc (Zn), cadmium (Cd), and/or mercury (Hg).

The term "Group III" as used herein may include Group IIIA elements and Group IIIB elements of the IUPAC periodic table, and the Group III element may include, for example, aluminum (Al), gallium (Ga), indium (In), and/or thallium (Tl).

The term "Group V" as used herein may include Group VA elements and Group VB elements of the IUPAC periodic table, and the Group V element may include, for example, nitrogen (N), phosphorus (P), arsenic (As), and/or antimony (Sb).

The term "Group VI" as used herein may include Group VIA elements and Group VIB elements of the IUPAC periodic table, and the Group VI element may include, for example, sulfur (S), selenium (Se), and/or tellurium (Te).

Hereinafter, embodiments of a quantum dot 100 and a method of preparing the same will be described with reference to FIG. 1.

According to an embodiment, provided is a quantum dot 100 including: a core 10 that includes a semiconductor compound including indium (In); and a shell 15 surrounding the core 10, the shell 15 including a first region 11 and a second region 12.

According to an embodiment, a method of preparing the quantum dot includes:

preparing a mixture including a semiconductor compound including indium (In), a first precursor including a first metal element, a second precursor including a second metal element, a third precursor including a third element, and a fourth precursor including a fourth element; and heating the mixture.

In one or more embodiments, the semiconductor compound including indium (In) may include: one or more binary compounds such as In, InP, InAs, InSb, InS, InSe, $In_2S_3$, $In_2Se_3$, InTe, and/or the like; ternary compounds such as InGaP, InNP, InAlP, InNAs, InNSb, InPAs, InPSb, $InGaS_3$, and/or $InGaSe_3$; quaternary compounds such as GaInNP, GaInNAs, GaInNSb, GaInPAs, GaInPSb, InAlNP, InAlNAs, InAlNSb, InAlPAs, and/or InAlPSb; or any combination thereof. The semiconductor compound may further include a Group II element, for example, InZnP, InGaZnP, InAlZnP, and/or the like.

Each element included in a multi-element compound such as the binary compound, the ternary compound, and/or the quaternary compound, may exist at a uniform concentration or non-uniform concentration in a particle.

The first precursor including the first metal element and the second precursor including the second metal element may be different from each other.

In one or more embodiments, the first metal element and the second metal element may be the same as each other.

In one or more embodiments, the first metal element and the second metal element may be different from each other.

In one or more embodiments, the first metal element and the second metal element may each independently be magnesium (Mg), titanium (Ti), manganese (Mn), iron (Fe), cobalt (Co), nickel (Ni), copper (Cu), zinc (Zn), cadmium (Cd), mercury (Hg), aluminum (Al), gallium (Ga), indium (In), thallium (Tl), tin (Sn), or lead (Pb).

The first precursor and the second precursor may each independently include: dimethyl zinc, diethyl zinc, zinc acetate, zinc acetylacetonate, zinc oleate, zinc stearate, zinc iodide, zinc bromide, zinc chloride, zinc fluoride, zinc carbonate, zinc cyanide, zinc nitrate, zinc oxide, zinc peroxide, zinc perchlorate, zinc sulfate, or any combination thereof.

In one or more embodiments, the first precursor and the second precursor may each independently include zinc carboxylate.

In one or more embodiments, the first precursor and the second precursor may each independently include zinc acetate, zinc acetylacetonate, zinc oleate, and/or zinc stearate.

In one or more embodiments, the first precursor may include zinc oleate, and the second precursor may include zinc acetate.

The first precursor and the second precursor may each independently include a $C_1$-$C_{60}$ alkyl group unsubstituted or substituted with at least one $R_{10a}$, a $C_2$-$C_{60}$ alkenyl group unsubstituted or substituted with at least one $R_{10a}$, or a $C_2$-$C_{60}$ alkynyl group unsubstituted or substituted with at least one $R_{10a}$, the number of carbons in the first precursor may be different from the number of carbons in the second precursor, and $R_{10a}$ may be:

deuterium, —F, —Cl, —Br, —I, a hydroxyl group, a cyano group, or a nitro group;

a $C_1$-$C_{60}$ alkyl group, a $C_2$-$C_{60}$ alkenyl group, a $C_2$-$C_{60}$ alkynyl group, or a $C_1$-$C_{60}$ alkoxy group, each unsubstituted or substituted with deuterium, —F, —Cl, —Br, —I, a hydroxyl group, a cyano group, a nitro group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, —Si$(Q_{11})(Q_{12})(Q_{13})$, —N$(Q_{11})(Q_{12})$, —B$(Q_{11})(Q_{12})$, —C(=O)$(Q_{11})$, —S(=O)$_2(Q_{11})$, —P(=O)$(Q_{11})(Q_{12})$, or any combination thereof;

a $C_3$-$C_{60}$ carbocyclic group, a $C_1$-$C_{60}$ heterocyclic group, a $C_6$-$C_{60}$ aryloxy group, or a $C_6$-$C_{60}$ arylthio group, each unsubstituted or substituted with deuterium, —F, —Cl, —Br, —I, a hydroxyl group, a cyano group, a nitro group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, —Si($Q_{21}$)($Q_{22}$)($Q_{23}$), —N($Q_{21}$)($Q_{22}$), —B($Q_{21}$)($Q_{22}$), —C(=O)($Q_{21}$), —S(=O)$_2$($Q_{21}$), —P(=O)($Q_{21}$)($Q_{22}$), or any combination thereof; or —Si($Q_{31}$)($Q_{32}$)($Q_{33}$), —N($Q_{31}$)($Q_{32}$), —B($Q_{31}$)($Q_{32}$), —C(=O)($Q_{31}$), —S(=O)$_2$($Q_{31}$), or —P(=O)($Q_{31}$)($Q_{32}$), wherein $Q_{11}$ to $Q_{13}$, $Q_{21}$ to $Q_{23}$, and $Q_{31}$ to $Q_{33}$ may each independently be: hydrogen; deuterium; —F; —Cl; —Br; —I; a hydroxyl group; a cyano group; a nitro group; a $C_1$-$C_{60}$ alkyl group; a $C_2$-$C_{60}$ alkenyl group; a $C_2$-$C_{60}$ alkynyl group; a $C_1$-$C_{60}$ alkoxy group; or a $C_3$-$C_{60}$ carbocyclic group or a $C_1$-$C_{60}$ heterocyclic group, each unsubstituted or substituted with deuterium, —F, a cyano group, a $C_1$-$C_{60}$ alkyl group, a $C_1$-$C_{60}$ alkoxy group, a phenyl group, a biphenyl group, or any combination thereof.

In one or more embodiments, the first precursor may include a $C_{11}$-$C_{60}$ alkyl group or a $C_{11}$-$C_{60}$ alkenyl group,
the second precursor may include a $C_1$-$C_{10}$ alkyl group, and
the amount of the first precursor may be larger (e.g., greater) than the amount of the second precursor in the mixture.

In one or more embodiments, the first precursor may include a $C_{15}$-$C_{60}$ alkenyl group,
the second precursor may include a $C_1$-$C_5$ alkyl group, and
the amount of the first precursor may be larger (e.g., greater) than the amount of the second precursor in the mixture.

In one or more embodiments, the first precursor may include zinc oleate, the second precursor may include zinc acetate, and the amount of the first precursor may be greater than the amount of the second precursor in the mixture.

In one or more embodiments, a molar ratio of the first precursor and the second precursor may satisfy a range of 99:1 to 51:49, a range of 95:5 to 60:40, or a range of 90:10 to 70:30.

The third element and the fourth element may be different from each other.

In one or more embodiments, the third element and the fourth element may each independently be a Group VI element.

The third element may be Se, and the fourth element may be S.

In one or more embodiments, the third precursor may include tributylphosphine-selenide (TBP-Se), trioctylphosphine-selenide (TOP-Se), or any combination thereof.

In one or more embodiments, the fourth precursor may include tributylphosphine-sulfide (TBP-S), trioctylphosphine-sulfide (TOP-S), or any combination thereof.

In one or more embodiments, a molar ratio of the third element and the fourth element may satisfy a range of 1:99 to 99:1, for example, a range of 80:20 to 20:80, a range of 75:25 to 25:75, or a range of 75:25 to 50:50.

The heating of the mixture may include:
a first heating performed at about 120° C. to about 280° C.; and
a second heating performed at about 280° C. to about 340° C.

In one or more embodiments, a rate of temperature increase in the first heating may be larger (e.g., faster or greater) than a rate of temperature increase in the second heating.

In one or more embodiments, the rate of temperature increase in the first heating may be about 30° C./min to about 35° C./min, for example, about 30° C./min to about 34° C./min, or about 31° C./min to about 33° C./min.

In one or more embodiments, the rate of temperature increase in the second heating may be about 2° C./min to about 8° C./min, for example, about 3° C./min to about 7° C./min, or about 3° C./min to about 5° C./min.

Other details on the method of preparing the quantum dot will be understood by a person skilled in the art with reference to examples to be described later.

The quantum dot 100 prepared by the above-described quantum dot preparation method includes: a core 10 including the semiconductor compound including indium (In); and a shell 15 around (e.g., surrounding) the core, and
the shell 15 includes a first region 11 and a second region 12.

The shell 15 is formed on the surface of the core 10 and serves as a protective layer for preventing or reducing chemical denaturation of the core 10 and maintaining semiconductor characteristics, and/or as a charging layer for imparting electrophoretic characteristics to the quantum dot 10.

The first region 11 may include a third element and a fourth element, and the second region 12 may include the fourth element.

In one or more embodiments, the concentration of the third element and the concentration of the fourth element in the first region 11 may have a concentration gradient that gradually increases or decreases along a direction from the surface of the core 10 toward the interface between the first region 11 and the second region 12 (direction A in FIG. 1).

The semiconductor compound including indium (In) in the core may include: one or more binary compounds such as InN, InP, InAs, InSb, InS, InSe, $In_2S_3$, $In_2Se_3$, and/or InTe; ternary compounds such as InGaP, InNP, InAlP, InNAs, InNSb, InPAs, InPSb, $InGaS_3$, and/or $InGaSe_3$; quaternary compounds such as GaInNP, GaInNAs, GaInNSb, GaInPAs, GaInPSb, InAlNP, InAlNAs, InAlNSb, InAlPAs, and/or InAlPSb; or any combination thereof. The semiconductor compound may further include a Group II element, for example, InZnP, InGaZnP, InAlZnP, and/or the like.

In one or more embodiments, the core may include InP.
In one or more embodiments, the shell may include CoS, CdSe, CdTe, ZnS, ZnSe, ZnTe, ZnSeS, ZnTeS, GaAs, GaP, GaSb, HgS, HgSe, HgTe, InAs, InP, InGaP, InSb, AlAs, AlP, AlSb, or any combination thereof.

In one or more embodiments, the first region may include $ZnSe_xS_{1-x}$ (wherein 0<x<1).
The second region may include ZnS.
In one or more embodiments, the quantum dot may have a diameter of about 4 nm to about 20 nm, for example, about 4.5 nm to about 15 nm, about 5 nm to about 12 nm, or about 6 nm to about 9 nm.

In one or more embodiments, a maximum emission wavelength of a photoluminescence (PL) spectrum of the quantum dot may be about 380 nm to about 750 nm, for example, about 400 nm to about 700 nm, about 420 nm to about 650 nm, about 450 nm to about 620 nm, about 480 nm to about 600 nm, about 500 nm to about 580 nm, about 510 nm to about 550 nm, about 520 nm to about 540 nm, or about 525 nm to about 540 nm.

In one or more embodiments, a full width at half maximum (FWHM) of the PL spectrum of the quantum dot may be about 50 nm or less, for example, about 45 nm or less, about 43 nm or less, about 40 nm or less, or about 38 nm or less. When the FWHM of the quantum dot satisfies the above ranges, the quantum dot may provide improved color purity and color reproducibility. In addition, because the light emitted through the quantum dot is emitted in all directions, the viewing angle of light may be improved.

In one or more embodiments, the shape of the quantum dot is not specifically limited, and may be any one commonly utilized in the art. For example, the quantum dot may be in the form of a spherical particle, a pyramidal particle, a multi-arm particle, a cubic nanoparticle, a nanotube particle, a nanowire particle, a nanofiber particle, or a nanoplate particle.

In some embodiments, when quantum dots are prepared by utilizing the quantum dot preparation method described above, the finally produced quantum dots may have a uniform size due to a difference in reactivity between the third element and the fourth element, even when the semiconductor compound including indium (In), for example, a semiconductor compound including InP, has non-uniform particle sizes.

In some embodiments, even when the finally produced quantum dots have different sizes, the quantum dots may have a narrower FWHM, due to a deviation in concentration gradient generated in the shell of each nucleus according to a deviation in nucleus size, and thus, may provide significantly improved color purity. A high-definition optical member and electronic apparatus may be provided by including the quantum dots therein.

In one or more embodiments, the quantum dots may further include a compound other than the above-described composition.

For example, the quantum dot may further include, in the core and the shell, a Group II-VI compound, a Group III-VI compound, a Group III-V compound, a Group IV-VI compound, a Group IV element or compound, a Group compound, or a combination thereof.

The Group II-VI compound may be selected from the group consisting of: binary compounds selected from CdS, CdSe, CdTe, ZnS, ZnSe, ZnTe, ZnO, HgS, HgSe, HgTe, MgSe, MgS, and mixtures thereof; ternary compounds selected from CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, and mixtures thereof; and quaternary compounds selected from CdZnSeS, CdZnSeTe, CdZnSTe, CdHgSeS, CdHgSeTe, CdHgSTe, HgZnSeS, HgZnSeTe, HgZnSTe, and mixtures thereof.

The Group III-VI compound may include: a binary compound, such as $In_2S_3$ and/or $In_2Se$; a ternary compound, such as $InGaS_3$ and/or $InGaSe_3$; or any combination thereof.

The Group III-V compound may be selected from the group consisting of: binary compounds selected from GaN, GaP, GaAs, GaSb, AlN, AlP, AlAs, AlSb, InN, InP, InAs, InSb, and mixtures thereof; ternary compounds selected from GaNP, GaNAs, GaNSb, GaPAs, GaPSb, AlNP, AlNAs, AlNSb, AlPAs, AlPSb, InGaP, InAlP, InNP, InNAs, InNSb, InPAs, InPSb, and mixtures thereof; and quaternary compounds selected from GaAlNP, GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, and mixtures thereof. The Group III-V semiconductor compound may further include a Group II metal (for example, InZnP, and/or the like).

The Group IV-VI compound may be selected from the group consisting of: binary compounds selected from SnS, SnSe, SnTe, PbS, PbSe, PbTe, and mixtures thereof; ternary compounds selected from SnSeS, SnSeTe, SnSTe, PbSeS, PbSeTe, PbSTe, SnPbS, SnPbSe, SnPbTe, and mixtures thereof; and quaternary compounds selected from SnPbSSe, SnPbSeTe, SnPbSTe, and mixtures thereof. The Group IV element may be selected from the group consisting of Si, Ge, and mixtures thereof.

The Group IV compound may be a binary compound selected from the group consisting of SiC, SiGe, and mixtures thereof.

The Group I-III-VI semiconductor compound may include a ternary compound, for example, AgInS, $AgInS_2$, CuInS, $CuInS_2$, $CuGaO_2$, $AgGaO_2$, $AgAlO_2$, or any combination thereof.

The binary compound, the ternary compound, and/or the quaternary compound may be present in particles at a uniform concentration, or may be present in particles with partially different concentration distributions.

In one or more embodiments, the shell may include a metal or non-metal oxide, a semiconductor compound, or a combination thereof.

For example, the metal or non-metal oxide may be a binary compound such as $SiO_2$, $Al_2O_3$, $TiO_2$, $ZnO$, $MnO$, $Mn_2O_3$, $Mn_3O_4$, $CuO$, $FeO$, $Fe_2O_3$, $Fe_3O_4$, $CoO$, $Co_3O_4$, and/or $NiO$, and/or a ternary compound such as $MgAl_2O_4$, $CoFe_2O_4$, $NiFe_2O_4$, and/or $CoMn_2O_4$.

For example, the semiconductor compound may be CdS, CdSe, CdTe, ZnS, ZnSe, ZnTe, ZnSeS, ZnTeS, GaAs, GaP, GaSb, HgS, HgSe, HgTe, InAs, InP, InGaP, InSb, AlAs, AlP, AlSb, and/or the like.

Optical Member

The quantum dot may be utilized in various suitable optical members. According to another embodiment, provided is an optical member including the quantum dot.

In one or more embodiments, the optical member may be a light control unit (e.g., means).

In one or more embodiments, the optical member may be a color filter, a color conversion member, a capping layer, a light-extraction efficiency enhancement layer, a selective light-absorption layer, and/or a polarizing layer.

Apparatus

The quantum dot may be utilized in various suitable electronic apparatuses. According to another embodiment, provided is an electronic apparatus including the quantum dot. For example, the apparatus may be a light-emitting device apparatus, an authentication apparatus, and/or the like.

According to an embodiment, provided is an electronic apparatus including: a light source, and a color conversion member arranged in an optical path of light emitted from the light source, wherein the color conversion member includes the quantum dot.

Figure 2:
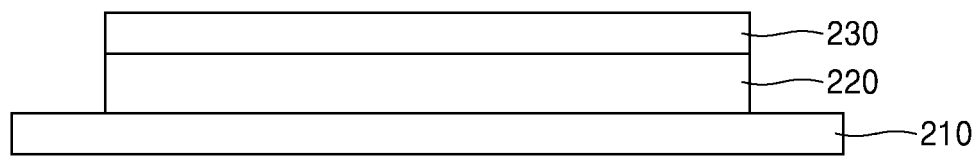
FIG. 2 is a schematic cross-sectional view showing a structure of an electronic apparatus according to an embodiment.

FIG. 2 is a schematic cross-sectional view showing a structure of an electronic apparatus 200A according to an embodiment. The electronic apparatus 200A of FIG. 2 includes a substrate 210, a light source 220 arranged on the substrate 210, and a color conversion member 230 arranged on the light source 220.

For example, the light source 220 may be a backlight unit (BLU) for usage in liquid crystal displays (LCD), a fluorescent lamp, a light-emitting device, an organic light-emitting device, or a quantum-dot light-emitting device (QLED), or any combination thereof. The color conversion member 230 may be arranged in at least one direction of travel of light emitted from the light source 220.

At least a region of the color conversion member 230 of the electronic apparatus 200A includes the quantum dot, and the region absorbs light emitted from the light source to emit blue light having a maximum light-emitting wavelength in a range of about 510 nm to about 540 nm.

That the color conversion member 230 is arranged in at least one direction of travel of the light emitted from the light source 220 does not exclude other elements from being further included between the color conversion member 230 and the light source 220.

For example, between the light source 220 and the color conversion member 230, a polarizing plate, a liquid crystal layer, a light guide plate, a diffusion plate, a prism sheet, a microlens sheet, a luminance enhancing sheet, a reflective film, a color filter, or any combination thereof may be additionally arranged.

In other embodiments, a polarizing plate, a liquid crystal layer, a light guide plate, a diffusion plate, a prism sheet, a microlens sheet, a luminance enhancing sheet, a reflective film, a color filter, or any combination thereof may be additionally arranged on the color conversion member 230.

The electronic apparatus 200A illustrated in FIG. 2, which is an embodiment according to the disclosure, may have any of various suitable (e.g., known) shapes, and accordingly, may further include various suitable (e.g., known) structures.

In other embodiments, the electronic apparatus may include a structure including a light source, a light guide plate, a color conversion member, a first polarizing plate, a liquid crystal layer, a color filter, and a second polarizing plate that are sequentially arranged in the stated order.

In still other embodiments, the electronic apparatus may include a structure including a light source, a light guide plate, a first polarizing plate, a liquid crystal layer, a second polarizing plate, and a color conversion member that are sequentially arranged in the stated order.

In the embodiments described above, the color filter may include a pigment and/or a dye. In the embodiments described above, one of the first polarizing plate and the second polarizing plate may be a vertical polarizing plate, and the other one may be a horizontal polarizing plate.

In other embodiments, the quantum dot as described in the present specification may be utilized as an emitter. According to another embodiment, provided is an electronic apparatus including a light-emitting device that includes: a first electrode; a second electrode facing the first electrode; and an emission layer arranged between the first electrode and the second electrode, wherein the light-emitting device (for example, the emission layer of the light-emitting device) includes the quantum dot. The light-emitting device may further include a hole transport region between the first electrode and the emission layer, an electron transport region between the emission layer and the second electrode, or a combination thereof.

Figure 3:
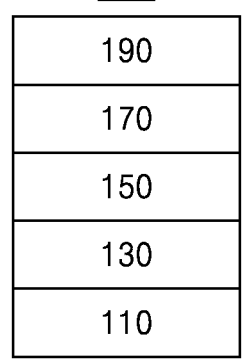
FIG. 3 is a schematic cross-sectional view showing a structure of an electronic apparatus according to an embodiment.

FIG. 3 is a schematic cross-sectional view showing a structure of a light-emitting device 10A according to an embodiment.

The light-emitting device 10A includes: a first electrode 110; a second electrode 190 facing the first electrode 110; an emission layer 150 that is located between the first electrode 110 and the second electrode 190 and includes the quantum dot; a hole transport region located between the first electrode 110 and the emission layer 150; and an electron transport region 170 located between the emission layer 150 and the second electrode 190. Hereinafter, the layers of the light-emitting device 10A will be described.

First Electrode 110

A substrate may be additionally located on a lower surface of the first electrode 110 and/or an upper surface of the second electrode 190. The substrate may be a glass substrate or a plastic substrate, each having excellent mechanical strength, thermal stability, transparency, surface smoothness, ease of handling, and/or water resistance.

For example, when the light-emitting device 10A is a top-emission device in which light is emitted in the opposite direction of a substrate, the substrate may not be transparent (e.g., essentially transparent), and may be opaque or semi-transparent. In this case, the substrate may be formed of metal, carbon, or any combination thereof. When the substrate is formed of metal, the substrate may include iron, chromium, manganese, nickel, titanium, molybdenum, stainless steel (SUS), an Invar alloy, an Inconel alloy, a Kovar alloy, or any combination thereof.

Although not illustrated in FIG. 3, in some embodiments, a buffer layer, a thin-film transistor, an organic insulating layer, and/or the like may be further included between the substrate and the first electrode 110.

The first electrode 110 may be formed by providing, on the substrate, a material for forming the first electrode 110, by utilizing a deposition and/or sputtering method. The first electrode 110 may be a reflective electrode, a semi-transmissive electrode, or a transmissive electrode. To form the first electrode 110 which is a transmission-type electrode, the material for the first electrode may include indium tin oxide (ITO), indium zinc oxide (IZO), tin oxide ($SnO_2$), zinc oxide (ZnO), gallium zinc oxide (GZO), aluminum zinc oxide (AZO), $InZnSnO_x$ (IZSO), $ZnSnO_x$ (ZSO), graphene, PEDOT:PSS, carbon nanotubes, silver (Ag) nanowire, gold (Au) nanowire, metal mesh, or any combination thereof. In one or more embodiments, when the first electrode 110 is a semi-transmissive electrode or a reflective electrode, a material for forming the first electrode may include magnesium (Mg), silver (Ag), aluminum (Al), aluminum-lithium (Al—Li), calcium (Ca), magnesium-indium (Mg—In), magnesium-silver (Mg—Ag), or any combinations thereof.

The first electrode 110 may have a single-layered structure or a multi-layered structure including two or more layers. For example, the first electrode 110 may have a three-layered structure of ITO/Ag/ITO.

Hole Transport Region 130

The hole transport region 130 may have: i) a single-layered structure consisting of a single layer consisting of a single material; ii) a single-layered structure consisting of a single layer including (e.g., consisting of) a plurality of different materials; or iii) a multi-layered structure including a plurality of layers including different materials.

The hole transport region 130 may include a hole injection layer, a hole transport layer, an emission auxiliary layer, an electron blocking layer, or any combination thereof.

For example, the hole transport region 130 may have a single-layered structure including a single layer including a plurality of different materials, or a multi-layered structure of a hole injection layer/hole transport layer structure, a hole injection layer/hole transport layer/emission auxiliary layer structure, a hole injection layer/emission auxiliary layer structure, a hole transport layer/emission auxiliary layer structure, or a hole injection layer/hole transport layer/electron blocking layer structure, wherein for each structure, the constituent layers are stacked sequentially from the first electrode 110 in the respective stated order.

The hole transport region 130 may include an amorphous inorganic material or organic material. The inorganic material may include NiO, $MoO_3$, $Cr_2O_3$, and/or $Bi_2O_3$. The inorganic material may include a p-type inorganic semiconductor, for example, a p-type inorganic semiconductor in which an iodide, bromide, and/or chloride of Cu, Ag and/or Au is doped with a non-metal such as O, S, Se and/or Te; a p-type inorganic semiconductor in which a Zn-containing compound is doped with a metal, such as Cu, Ag and/or Au, and a non-metal, such as N, P, As, Sb and/or Bi; or a spontaneous p-type inorganic semiconductor such as ZnTe.

The organic material may include m-MTDATA, TDATA, 2-TNATA, NPB (NPD), β-NPB, TPD, Spiro-TPD, Spiro-NPB, methylated-NPB, TAPC, HMTPD, 4,4',4''-tris(N-carbazolyl)triphenylamine (TCTA), polyaniline/dodecylbenzenesulfonic acid (PANI/DBSA), poly(3,4-ethylenedioxythiophene)/poly(4-styrenesulfonate) (PEDOT/PSS), polyaniline/camphor sulfonic acid (PANI/CSA), polyaniline/poly(4-styrenesulfonate) (PANI/PSS), polyvinylcarbazole (PVK), a compound represented by Formula 201, a compound represented by Formula 202, or any combination thereof:

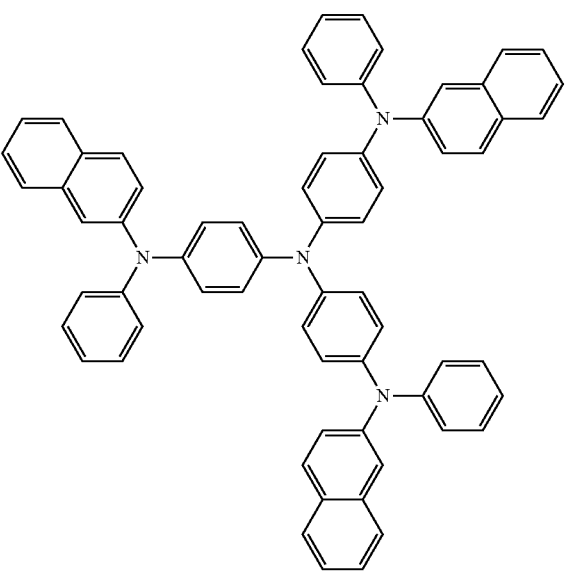

2-TNATA

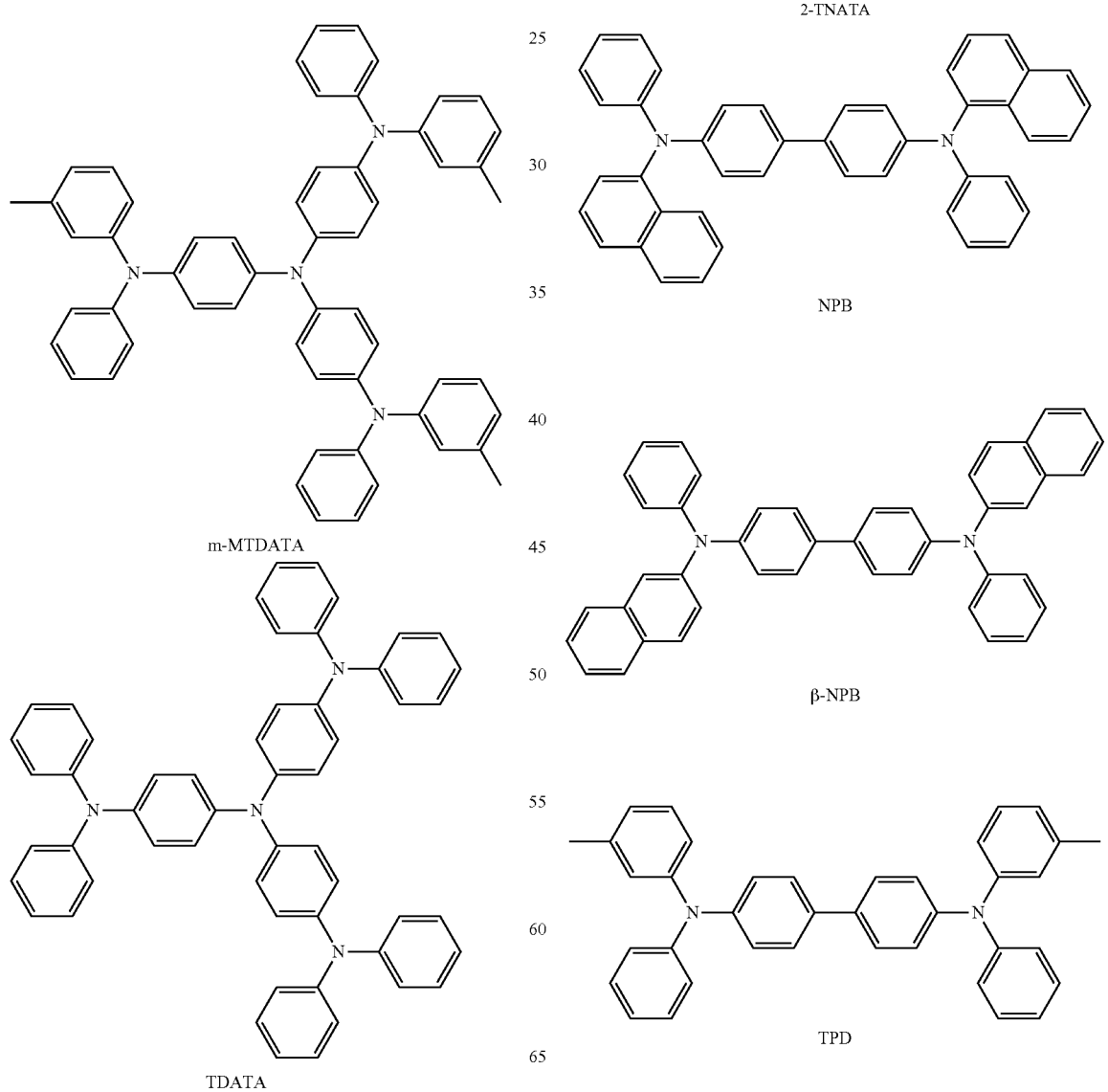

m-MTDATA

NPB

β-NPB

TDATA

TPD

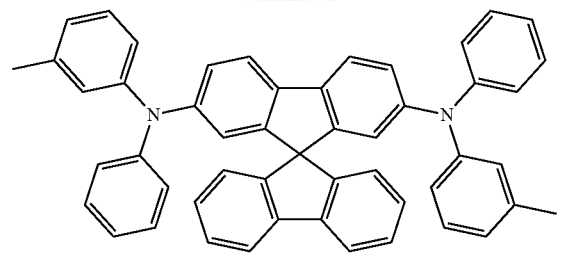

Spiro-TPD

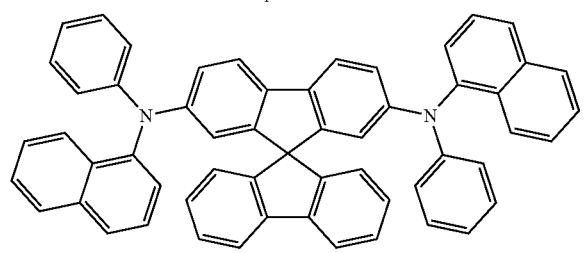

Spiro-NPB

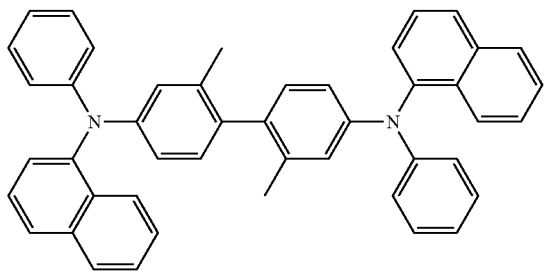

methylated-NPB

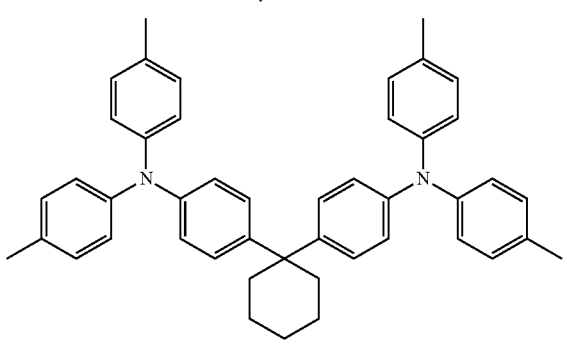

TAPC

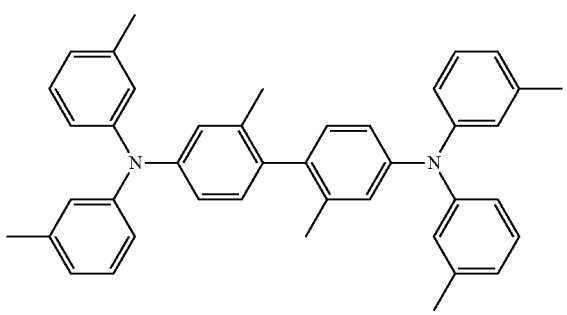

HMTPD

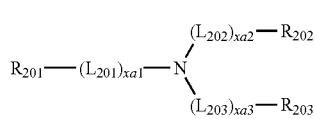

Formula 201

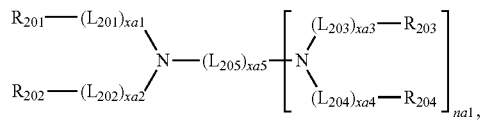

Formula 202 wherein, in Formulae 201 and 202, $L_{201}$ to $L_{204}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, $L_{205}$ may be *—N($Q_{201}$)-*', a $C_1$-$C_{20}$ alkylene group unsubstituted or substituted with at least one $R_{10a}$, a $C_2$-$C_{20}$ alkenylene group unsubstituted or substituted with at least one $R_{10a}$, a $C_3$-$C_{60}$ carbocyclic group unsubstituted or substituted with at least one $R_{10a}$, or a $C_1$-$C_{60}$ heterocyclic group unsubstituted or substituted with at least one $R_{10a}$, xa1 to xa4 may each independently be an integer from 0 to 5, xa5 may be an integer from 1 to 10, and $R_{201}$ to $R_{204}$ and $Q_{201}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, $R_{201}$ and $R_{202}$ may optionally be linked to each other, via a single bond, a $C_1$-$C_5$ alkylene group unsubstituted or substituted with at least one $R_{10a}$, or a $C_2$-$C_5$ alkenylene group unsubstituted or substituted with at least one $R_{10a}$, to form a $C_8$-$C_{60}$ polycyclic group unsubstituted or substituted with at least one $R_{10a}$ (for example, a carbazole group), $R_{203}$ and $R_{204}$ may optionally be linked to each other, via a single bond, a $C_1$-$C_5$ alkylene group unsubstituted or substituted with at least one $R_{10a}$, or a $C_2$-$C_5$ alkenylene group unsubstituted or substituted with at least one $R_{10a}$, to form a $C_8$-$C_{50}$ polycyclic group unsubstituted or substituted with at least one $R_{10a}$, and na1 may be an integer from 1 to 4.

The hole transport region 130 may have a thickness of about 50 Å to about 10000 Å, for example, about 100 Å to about 4000 Å. When the hole transport region 130 includes a hole injection layer, a hole transport layer, or any combination thereof, a thickness of the hole injection layer may be in a range of about 100 Å to about 9,000 Å, for example, about 100 Å to about 1,000 Å, and a thickness of the hole-transporting layer may be in a range of about 50 Å to about 2,000 Å, for example, about 100 Å to about 1,500 Å. When the thicknesses of the hole transport region 130, the hole injection layer, and the hole-transporting layer are within these ranges, satisfactory hole transporting characteristics may be obtained without a substantial increase in driving voltage.

The emission auxiliary layer may increase light-emission efficiency by compensating for an optical resonance distance according to the wavelength of light emitted by the emission layer, and the electron blocking layer may block or reduce the leakage of electrons from the emission layer to the hole transport region 130. Materials that may be included in the hole transport region 130 may be included in the emission auxiliary layer and the electron blocking layer.

p-Dopant

The hole transport region 130 may further include, in addition to the materials described above, a charge-generation material for the improvement of conductive characteristics. The charge-generation material may be uniformly or non-uniformly dispersed in the hole transport region 130 (for example, in the form of a single layer consisting of a charge generation material).

The charge-generation material may be, for example, a p-dopant.

For example, the In an embodiment, the lowest unoccupied molecular orbital (LUMO) energy level of the p-dopant may be −3.5 eV or less.

In an embodiment, the p-dopant may include a quinone derivative, a cyano group-containing compound, a compound containing element EL1 and element EL2, or any combination thereof.

Examples of the quinone derivative may include (e.g., may be) TCNQ, F4-TCNQ, etc.

Examples of the cyano group-containing compound may include (e.g., may be) HAT-CN, and a compound represented by Formula 221 below.

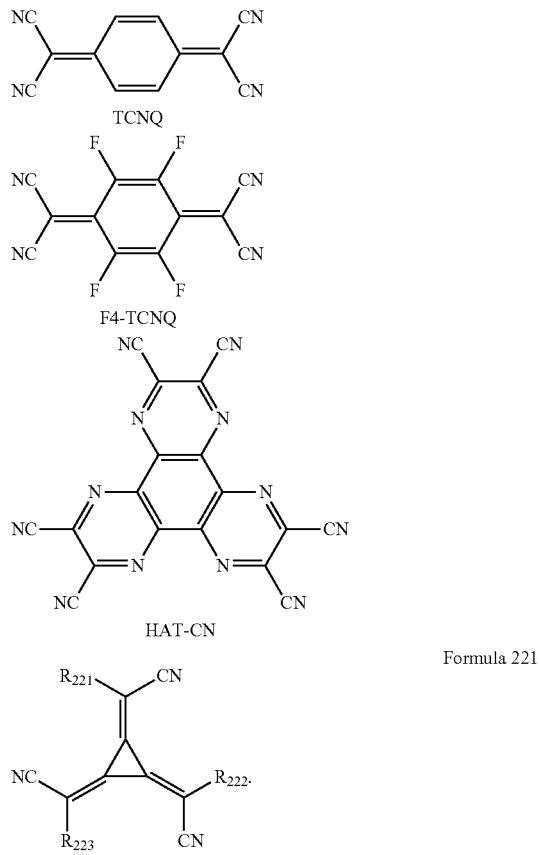

In Formula 221,

R$_{221}$ to R$_{223}$ may each independently be a C$_3$-C$_{60}$ carbocyclic group unsubstituted or substituted with at least one R$_{10a}$ or a C$_1$-C$_{60}$ heterocyclic group unsubstituted or substituted with at least one R$_{10a}$, and at least one of R$_{221}$ to R$_{223}$ may each independently be a C$_3$-C$_{60}$ carbocyclic group or a C$_1$-C$_{60}$ heterocyclic group, each substituted with: a cyano group; —F; —Cl; —Br; —I; a C$_1$-C$_{20}$ alkyl group substituted with a cyano group, —F, —Cl, —Br, —I, or any combination thereof; or any combination thereof.

In the compound including element EL1 and element EL2, element EL1 may be metal, metalloid, or a combination thereof, and element EL2 may be a non-metal, a metalloid, or a combination thereof.

Examples of the metal may include (e.g., may be) an alkali metal (for example, lithium (Li), sodium (Na), potassium (K), rubidium (Rb), cesium (Cs), etc.); an alkaline earth metal (for example, beryllium (Be), magnesium (Mg), calcium (Ca), strontium (Sr), barium (Ba), etc.); a transition metal (for example, titanium (Ti), zirconium (Zr), hafnium (Hf), vanadium (V), niobium (Nb), tantalum (Ta), chromium (Cr), molybdenum (Mo), tungsten (W), manganese (Mn), technetium (Tc), rhenium (Re), iron (Fe), ruthenium (Ru), osmium (Os), cobalt (Co), rhodium (Rh), iridium (Ir), nickel (Ni), palladium (Pd), platinum (Pt), copper (Cu), silver (Ag), gold (Au), etc.); a post-transition metal (for example, zinc (Zn), indium (In), tin (Sn), etc.); and a lanthanide metal (for example, lanthanum (La), cerium (Ce), praseodymium (Pr), neodymium (Nd), promethium (Pm), samarium (Sm), europium (Eu), gadolinium (Gd), terbium (Tb), dysprosium (Dy), holmium (Ho), erbium (Er), thulium (Tm), ytterbium (Yb), lutetium (Lu), etc.).

Examples of the metalloid may include silicon (Si), antimony (Sb), and tellurium (Te).

Examples of the non-metal may include oxygen (O) and halogen (for example, F, Cl, Br, I, etc.).

For example, the compound containing element EU and element EL2 may include metal oxide, metal halide (for example, metal fluoride, metal chloride, metal bromide, metal iodide, and/or the like), metalloid halide (for example, metalloid fluoride, metalloid chloride, metalloid bromide, metalloid iodide, and/or the like), metal telluride, or any combination thereof.

Examples of the metal oxide may include tungsten oxide (for example, WO, W$_2$O$_3$, WO$_2$, WO$_3$, W$_2$O$_5$, and/or the like), vanadium oxide (for example, VO, V$_2$O$_3$, VO$_2$, V$_2$O$_5$, and/or the like), molybdenum oxide (MoO, Mo$_2$O$_3$, MoO$_2$, MoO$_3$, Mo$_2$O$_5$, and/or the like), and rhenium oxide (for example, ReO$_3$, and/or the like).

Examples of the metal halide may include alkali metal halide, alkaline earth metal halide, transition metal halide, post-transition metal halide, and lanthanide metal halide.

Examples of the alkali metal halide may include LiF, NaF, KF, RbF, CsF, LiCl, NaCl, KCl, RbCl, CsCl, LiBr, NaBr, KBr, RbBr, CsBr, LiI, NaI, KI, RbI, and CsI.

Examples of the alkaline earth metal halide may include BeF$_2$, MgF$_2$, CaF$_2$, SrF$_2$, BaF$_2$, BeCl$_2$, MgCl$_2$, CaCl$_2$), SrCl$_2$, BaCl$_2$, BeBr$_2$, MgBr$_2$, CaBr$_2$, SrBr$_2$, BaBr$_2$, BeI$_2$, MgI$_2$, CaI$_2$, SrI$_2$, and BaI$_2$.

Examples of the transition metal halide may include titanium halide (for example, TiF$_4$, TiCl$_4$, TiBr$_4$, TiI$_4$, etc.), zirconium halide (for example, ZrF$_4$, ZrCl$_4$, ZrBr$_4$, ZrI$_4$, etc.), hafnium halide (for example, HfF$_4$, HfCl$_4$, HfBr$_4$, HfI$_4$, etc.), vanadium halide (for example, VF$_3$, VCl$_3$, VBr$_3$, VI$_3$, etc.), niobium halide (for example, NbF$_3$, NbCl$_3$, NbBr$_3$, Nbi$_3$, etc.), tantalum halide (for example, TaF$_3$, TaCl$_3$, TaBr$_3$, TaI$_3$, etc.), chromium halide (for example, CrF$_3$, CrCl$_3$, CrBr$_3$, CrI$_3$, etc.), molybdenum halide (for example, MoF$_3$, MoCl$_3$, MoBr$_3$, MoI$_3$, etc.), tungsten halide (for example, WF$_3$, WCl$_3$, WBr$_3$, WI$_3$, etc.), manganese halide (for example, MnF$_2$, MnCl$_2$, MnBr$_2$, MnI$_2$, etc.), technetium halide (for example, TcF$_2$, TcCl$_2$, TcBr$_2$, TcI$_2$, etc.), rhenium halide (for example, ReF$_2$, ReCl$_2$, ReBr$_2$, ReI$_2$, etc.), iron halide (for example, FeF$_2$, FeCl$_2$, FeBr$_2$, FeI$_2$, etc.), ruthenium halide (for example, RuF$_2$, RuCl$_2$, RuBr$_2$, RuI$_2$, etc.), osmium halide (for example, OsF$_2$, OsCl$_2$, OsBr$_2$, OsI$_2$, etc.), cobalt halide (for example, CoF$_2$, CoCl$_2$, CoBr$_2$, CoI$_2$, etc.), rhodium halide (for example, RhF$_2$, RhCl$_2$, RhBr$_2$, RhI$_2$, etc.), iridium halide (for example, $IrF_2$, $IrCl_2$, $IrBr_2$, $IrI_2$, etc.), nickel halide (for example, $NiF_2$, $NiCl_2$, $NiBr_2$, $NiI_2$, etc.), palladium halide (for example, $PdF_2$, $PdCl_2$, $PdBr_2$, $PdI_2$, etc.), platinum halide (for example, $PtF_2$, $PtCl_2$, $PtBr_2$, $PtI_2$, etc.), copper halide (for example, CuF, CuCl, CuBr, CuI, etc.), silver halide (for example, AgF, AgCl, AgBr, AgI, etc.), and gold halide (for example, AuF, AuCl, AuBr, AuI, etc.).

Examples of the post-transition metal halide may include zinc halide (for example, $ZnF_2$, $ZnCl_2$, $ZnBr_2$, $ZnI_2$, etc.), indium halide (for example, $InI_3$, etc.), and tin halide (for example, $SnI_2$, etc.).

Examples of the lanthanide metal halide may include YbF, $YbF_2$, $YbF_3$, $SmF_3$, YbCl, $YbCl_2$, $YbCl_3$ $SmCl_3$, YbBr, $YbBr_2$, $YbBr_3$, $SmBr_3$, YbI, $YbI_2$, $YbI_3$, and $SmI_3$.

Examples of the metalloid halide may include antimony halide (for example, $SbCl_5$, etc.).

Examples of the metal telluride may include alkali metal telluride (for example, $Li_2Te$, $Na_2Te$, $K_2Te$, $Rb_2Te$, $Cs_2Te$, etc.), alkaline earth metal telluride (for example, BeTe, MgTe, CaTe, SrTe, BaTe, etc.), transition metal telluride (for example, $TiTe_2$, $ZrTe_2$, $HfTe_2$, $V_2Te_3$, $Nb_2Te_3$, $Ta_2Te_3$, $Cr_2Te_3$, $Mo_2Te_3$, $W_2Te_3$, MnTe, TcTe, ReTe, FeTe, RuTe, OsTe, CoTe, RhTe, IrTe, NiTe, PdTe, PtTe, $Cu_2Te$, CuTe, $Ag_2Te$, AgTe, $Au_2Te$, etc.), post-transition metal telluride (for example, ZnTe, etc.), and lanthanide metal telluride (for example, LaTe, CeTe, PrTe, NdTe, PmTe, EuTe, GdTe, TbTe, DyTe, HoTe, ErTe, TmTe, YbTe, LuTe, etc.).

Emission Layer 150

The emission layer 150 may be a quantum-dot single layer (e.g., a single layer containing quantum dots) or a structure in which two or more quantum-dot layers are stacked. For example, the emission layer 150 may be a quantum-dot single layer or may have a structure in which 2 to 100 quantum-dot layers are stacked.

The emission layer 150 may include the quantum dot (e.g., a plurality of the quantum dots) as described in the present specification.

The emission layer 150 may further include, in addition to the quantum dot as described in the present specification, a dispersion medium in which the quantum dots are dispersed in a naturally coordinated form. The dispersion medium may include an organic solvent, a polymer resin, or any combination thereof. The dispersion medium may be any transparent medium that does not affect the optical performance of the quantum dot, is not deteriorated by light, does not reflect light, and/or does not absorb light. For example, the solvent may include toluene, chloroform, ethanol, octane, or any combination thereof, and the polymer resin may include epoxy resin, silicone resin, polystyrene resin, acrylate resin, or any combination thereof.

The emission layer 150 may be formed by coating, on the hole transport region 130, a quantum dot-containing composition for forming the emission layer, and volatilizing a portion or more of the solvent from the composition for forming the emission layer.

For example, as the solvent, water, hexane, chloroform, toluene, octane, and/or the like may be utilized.

The coating of the composition for forming the emission layer may be performed utilizing a spin coat method, a casting method, a micro gravure coating method, a gravure coating method, a bar coating method, a roll coating method, a wire bar coating method, a dip coating method, a spray coating method, a screen printing method, a flexographic method, an offset printing method, an ink jet printing method, and/or the like.

When the light-emitting device 10A is a full-color light-emitting device, the emission layer 150 may include emission layers that emit light of different colors according to individual subpixels.

For example, the emission layer 150 may be patterned into a first-color emission layer, a second-color emission layer, and a third-color emission layer according to individual subpixels. Here, at least one emission layer of the emission layers described above may essentially include the quantum dot (e.g., may include the quantum dots as the main component). For example, the first-color emission layer may be a quantum-dot emission layer including the quantum dot, and the second-color emission layer and the third-color emission layer may be organic emission layers including organic compounds, respectively. In regard to this, the first color to the third color are different colors, and for example, the first color to the third color may have different maximum luminescence wavelengths. The first color to the third color may product white color when combined with each other.

In other embodiments, the emission layer 150 may further include a fourth-color emission layer, and at least one emission layer of the first-color to third-color emission layers may be a quantum-dot emission layer including the quantum dot, and the remaining emission layers may be organic emission layers including organic compounds, respectively. Other various suitable modifications are possible. In regard to this, the first color to the fourth color are different colors, and for example, the first color to the fourth color may have different maximum luminescence wavelengths. The first color to the fourth color may produce white color when combined with each other.

In one or more embodiments, the light-emitting device 10A may have a stacked structure in which two or more emission layers that emit light of identical or different colors contact each other or are separated from each other. At least one emission layer of the two or more emission layers may be a quantum-dot emission layer including the quantum dot, and the remaining emission layer may be an organic emission layer including an organic compound. Other various suitable modifications are possible. In some embodiments, the light-emitting device 10A may include a first-color emission layer and a second-color emission layer, and the first color and the second color may be the same color or different colors. For example, the first color and the second color may be both blue.

The emission layer 150 may further include, in addition to the quantum dot, at least one selected from among an organic compound and a semiconductor compound.

For example, the organic compound may include a host and a dopant. The host and the dopant may include a host and a dopant that are commonly utilized in organic light-emitting devices, respectively.

For example, the semiconductor compound may be an organic and/or inorganic perovskite.

Electron Transport Region 170

The electron transport region 170 may have: i) a single-layered structure consisting of a single layer consisting of a single material; ii) a single-layered structure consisting of a single layer including (e.g., consisting of) a plurality of different materials; or iii) a multi-layered structure including a plurality of layers including different materials.

The electron transport region 170 may include at least one layer selected from among a buffer layer, a hole blocking layer, an electron control layer, an electron transport layer, and an electron injection layer. However, embodiments of the present disclosure are not limited thereto.

For example, the electron transport region 170 may have an electron transport layer/electron injection layer structure, a hole blocking layer/electron transport layer/electron injection layer structure, an electron control layer/electron transport layer/electron injection layer structure, or a buffer layer/electron transport layer/electron injection layer structure, wherein for each structure, the constituent layers are stacked sequentially from the emission layer in the respective stated order. However, embodiments are not limited thereto.

The electron transport region 170 may include a conductive metal oxide. For example, the electron transport region 170 may include ZnO, TiO$_2$, WO$_3$, SnO$_2$, In$_2$O$_3$, Nb$_2$O$_5$, Fe$_2$O$_3$, CeO$_2$, SrTiO$_3$, Zn$_2$SnO$_4$, BaSnO$_3$, In$_2$S$_3$, ZnSiO, PC60BM, PC70BM, Mg-doped ZnO (ZnMgO), Al-doped ZnO (AZO), Ga-doped ZnO (GZO), In-doped ZnO (IZO), Al-doped TiO$_2$, Ga-doped TiO$_2$, In-doped TiO$_2$, Al-doped WO$_3$, Ga-doped WO$_3$, In-doped WO$_3$, Al-doped SnO$_2$, Ga-doped SnO$_2$, In-doped SnO$_2$, Mg-doped In$_2$O$_3$, Al-doped In$_2$O$_3$, Ga-doped In$_2$O$_3$, Mg-doped Nb$_2$O$_5$, Al-doped Nb$_2$O$_5$, Ga-doped Nb$_2$O$_5$, Mg-doped Fe$_2$O$_3$, Al-doped Fe$_2$O$_3$, Ga-doped Fe$_2$O$_3$, In-doped Fe$_2$O$_3$, Mg-doped CeO$_2$, Al-doped CeO$_2$, Ga-doped CeO$_2$, In-doped CeO$_2$, Mg-doped SrTiO$_3$, Al-doped SrTiO$_3$, Ga-doped SrTiO$_3$, In-doped SrTiO$_3$, Mg-doped Zn$_2$SnO$_4$, Al-doped Zn$_2$SnO$_4$, Ga-doped Zn$_2$SnO$_4$, In-doped Zn$_2$SnO$_4$, Mg-doped BaSnO$_3$, Al-doped BaSnO$_3$, Ga-doped BaSnO$_3$, In-doped BaSnO$_3$, Mg-doped In$_2$S$_3$, Al-doped In$_2$S$_3$, Ga-doped In$_2$S$_3$, In-doped In$_2$S$_3$, Mg-doped ZnSiO, Al-doped ZnSiO, Ga-doped ZnSiO, In-doped ZnSiO, or any combination thereof.

The organic material may include a suitable (e.g., known) compound having electron transport capability, such as 2,9-dimethyl-4,7-diphenyl-1,10-phenanthroline (BCP), 4,7-diphenyl-1,10-phenanthroline (Bphen), Alq3, BAlq, 3-(biphenyl-4-yl)-5-(4-tert-butylphenyl)-4-phenyl-4H-1,2,4-triazole (TAZ), NTAZ, and/or the like:

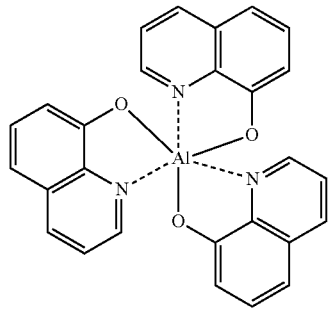

Alq$_3$

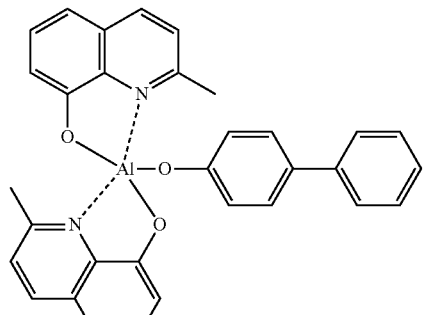

BAlq

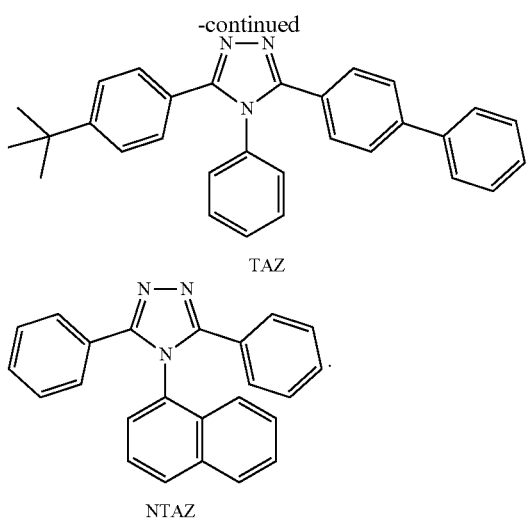

TAZ

NTAZ

The organic material may be a metal-free compound including at least one π electron-deficient nitrogen-containing C$_1$-C$_{60}$ cyclic group.

For example, the electron transport region 170 may include a compound represented by Formula 601.

$$[Ar_{601}]_{xe11}-[(L_{601})_{xe1}-R_{601}]_{xe21}$$  Formula 601 wherein, in Formula 601,

Ar$_{601}$ and L$_{601}$ may each independently be a C$_3$-C$_{60}$ carbocyclic group unsubstituted or substituted with at least one R$_{10a}$ or a C$_1$-C$_{60}$ heterocyclic group unsubstituted or substituted with at least one R$_{10a}$, xe11 may be 1, 2, or 3, xe1 may be 0, 1, 2, 3, 4, or 5, R$_{601}$ may be a C$_3$-C$_{60}$ carbocyclic group unsubstituted or substituted with at least one R$_{10a}$, a C$_1$-C$_{60}$ heterocyclic group unsubstituted or substituted with at least one R$_{10a}$, —Si(Q$_{601}$)(Q$_{602}$)(Q$_{603}$), —C(=O)(Q$_{601}$), —S(=O)$_2$(Q$_{601}$), or —P(=O)(Q$_{601}$)(Q$_{602}$), Q$_{601}$ to Q$_{603}$ may be each independently the same as defined in connection with Q$_1$, xe21 may be 1, 2, 3, 4, or 5, and at least one of Ar$_{601}$, L$_{601}$, and R$_{601}$ may each independently be a π electron-deficient nitrogen-containing C$_1$-C$_{60}$ cyclic group unsubstituted or substituted with at least one R$_{10a}$.

The electron transport region 170 may have a thickness of about 160 Å to about 5000 Å, for example, about 00 Å to about 4000 Å. When the electron transport region 170 includes a buffer layer, a hole-blocking layer, an electron control layer, an electron transport layer, or any combination thereof, a thickness of the buffer layer, the hole-blocking layer, or the electron control layer may each independently be from about 20 Å to about 1000 Å, for example, about 30 Å to about 300 Å, and a thickness of the electron transport layer may be from about 100 Å to about 1000 Å, for example, about 150 Å to about 500 Å. When the thicknesses of the buffer layer, the hole blocking layer, the electron control layer, the electron transport layer and/or the electron transport layer are within these ranges, satisfactory electron transport characteristics may be obtained without a substantial increase in driving voltage.

The electron transport region 170 (for example, the electron transport layer in the electron transport region) may further include, in addition to the materials described above, a metal-containing material.

The metal-containing material may include an alkali metal complex, an alkaline earth metal complex, or any combination thereof. A metal ion of the alkali metal complex may be a Li ion, a Na ion, a K ion, a Rb ion, or a Cs ion, and a metal ion of the alkaline earth metal complex may be a Be ion, a Mg ion, a Ca ion, a Sr ion, or a Ba ion. A ligand coordinated with the metal ion of the alkali metal complex or the alkaline earth-metal complex may include a hydroxyquinoline, a hydroxyisoquinoline, a hydroxybenzoquinoline, a hydroxyacridine, a hydroxyphenanthridine, a hydroxyphenyloxazole, a hydroxyphenylthiazole, a hydroxyphenyloxadiazole, a hydroxyphenylthiadiazole, a hydroxyphenylpyridine, a hydroxyphenylbenzimidazole, a hydroxyphenylbenzothiazole, a bipyridine, a phenanthroline, a cyclopentadiene, or any combination thereof.

For example, the metal-containing material may include a Li complex. The Li complex may include, for example, Compound ET-D1 (LiQ) or ET-D2:

ET-D1

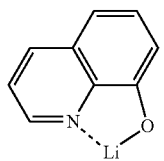

ET-D2

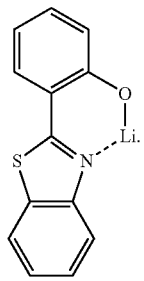

The electron transport region 170 may include an electron injection layer that facilitates the injection of electrons from the second electrode 190. The electron injection layer may directly contact the second electrode 190.

The electron injection layer may have: i) a single-layered structure consisting of a single layer consisting of a single material; ii) a single-layered structure consisting of a single layer including (e.g., consisting of) a plurality of different materials; or iii) a multi-layered structure including a plurality of layers including different materials.

The electron injection layer may include an alkali metal, an alkaline earth metal, a rare earth metal, an alkali metal-containing compound, an alkaline earth metal-containing compound, a rare earth metal-containing compound, an alkali metal complex, an alkaline earth metal complex, a rare earth metal complex, or any combination thereof.

The alkali metal may include Li, Na, K, Rb, Cs, or any combination thereof. The alkaline earth metal may include Mg, Ca, Sr, Ba, or any combination thereof. The rare earth metal may include Sc, Y, Ce, Tb, Yb, Gd, or any combination thereof.

The alkali metal-containing compound, the alkaline earth metal-containing compound, and the rare earth metal-containing compound may be: one or more oxides, halides (for example, fluorides, chlorides, bromides, and/or iodides), tellurides of the alkali metal, the alkaline earth metal, and the rare earth metal, or any combination thereof.

The alkali metal-containing compound may include: one or more alkali metal oxides such as $Li_2O$, $Cs_2O$, and/or $K_2O$; alkali metal halides such as LiF, NaF, CsF, KF, LiI, NaI, CsI, and/or KI; or any combination thereof. The alkaline earth metal-containing compound may include an alkaline earth metal compound, such as BaO, SrO, CaO, $Ba_xSr_{1-x}O$ (wherein x is a real number satisfying the condition of $0<x<1$), $Ba_xCa_{1-x}O$ (wherein x is a real number satisfying the condition of $0<x<1$), and/or the like. The rare earth metal-containing compound may include $YbF_3$, $ScF_3$, $Sc_2O_3$, $Y_2O_3$, $Ce_2O_3$, $GdF_3$, $TbF_3$, $YbI_3$, $ScI_3$, $TbI_3$, or any combination thereof. In other embodiments, the rare earth metal-containing compound may include lanthanide metal telluride. Examples of the lanthanide metal telluride may include (e.g., may be) LaTe, CeTe, PrTe, NdTe, PmTe, SmTe, EuTe, GdTe, TbTe, DyTe, HoTe, ErTe, TmTe, YbTe, LuTe, $La_2Te_3$, $Ce_2Te_3$, $Pr_2Te_3$, $Nd_2Te_3$, $Pm_2Te_3$, $Sm_2Te_3$, $Eu_2Te_3$, $Gd_2Te_3$, $Tb_2Te_3$, $Dy_2Te_3$, $Ho_2Te_3$, $Er_2Te_3$, $Tm_2Te_3$, $Yb_2Te_3$, and $Lu_2Te_3$.

The alkali metal complex, the alkaline earth-metal complex, and the rare earth metal complex may include: i) ions of one of the alkali metal, the alkaline earth metal, and the rare earth metal; and ii), as a ligand bonded to the metal ion, for example, a hydroxyquinoline, a hydroxyisoquinoline, a hydroxybenzoquinoline, a hydroxyacridine, a hydroxyphenanthridine, a hydroxyphenyloxazole, a hydroxyphenylthiazole, a hydroxyphenyloxadiazole, a hydroxyphenylthiadiazole, a hydroxyphenylpyridine, a hydroxyphenylbenzimidazole, a hydroxyphenylbenzothiazole, a bipyridine, a phenanthroline, a cyclopentadiene, or any combination thereof.

In some embodiments, the electron injection layer may consist exclusively of (e.g., may consist essentially of) an alkali metal, an alkaline earth metal, a rare earth metal, an alkali metal-containing compound, an alkaline earth metal-containing compound, a rare earth metal-containing compound, an alkali metal complex, an alkaline earth metal complex, a rare earth metal complex, or any combination thereof, as described above. In one or more embodiments, the electron injection layer may further include an organic material (for example, a compound represented by Formula 601).

In one or more embodiments, the electron injection layer may include (e.g., consist of): i) an alkali metal-containing compound (for example, an alkali metal halide); or ii) a) an alkali metal-containing compound (for example, an alkali metal halide), and b) an alkali metal, an alkaline earth metal, a rare earth metal, or any combination thereof. For example, the electron injection layer may be a KI:Yb co-deposited layer, an RbI:Yb co-deposited layer, and/or the like.

When the electron injection layer further includes an organic material, the alkali metal, the alkaline earth metal, the rare earth metal, the alkali metal-containing compound, the alkaline earth metal-containing compound, the rare earth metal-containing compound, the alkali metal complex, the alkaline earth-metal complex, the rare earth metal complex, or any combination thereof may be homogeneously or non-homogeneously dispersed in a matrix including the organic material.

A thickness of the electron injection layer may be in a range of about 1 Å to about 100 Å, for example, about 3 Å to about 90 Å. When the thickness of the electron injection layer is within the ranges described above, the electron injection layer may have satisfactory electron injection characteristics without a substantial increase in driving voltage.

Second Electrode 190

The second electrode 190 is located on an upper surface of the electron transport region 170 as described above. The second electrode 190 may be a cathode, which is an electron injection electrode, and as the material for the second electrode 190, a metal, an alloy, an electrically conductive compound, or any combination thereof, each having a low work function, may be utilized.

The second electrode 190 may include lithium (Li), silver (Ag), magnesium (Mg), aluminum (Al), aluminum-lithium (Al—Li), calcium (Ca), magnesium-indium (Mg—In), magnesium-silver (Mg—Ag), ytterbium (Yb), silver-ytterbium (Ag—Yb), ITO, IZO, or any combination thereof. The second electrode 190 may be a transmissive electrode, a semi-transmissive electrode, or a reflective electrode.

The second electrode 190 may have a single-layered structure or a multi-layered structure including a plurality of layers.

The electronic apparatus (for example, a light-emitting apparatus) may further include, in addition to the light-emitting device 10A, i) a color filter, ii) a color conversion layer, or iii) a color filter and a color conversion layer. The color filter and/or the color conversion layer may be located in at least one direction of travel of light emitted from the light-emitting device 10A. For example, light emitted from the light-emitting device 10A may be blue light or white light. For details on the light-emitting device 10A, related descriptions provided above may be referred to. In one or more embodiments, the color conversion layer may include a quantum dot (e.g., a plurality of quantum dots). The quantum dot may be, for example, a quantum dot as described herein.

The electronic apparatus may further include a thin-film transistor, in addition to the light-emitting device 10A as described above. The thin-film transistor may include a source electrode, a drain electrode, and an activation layer, and the source electrode or the drain electrode may be electrically connected to one of the first electrode 110 and the second electrode 190 of the light-emitting device 10A.

The thin-film transistor may further include a gate electrode, a gate insulating film, and/or the like.

The activation layer may include crystalline silicon, amorphous silicon, organic semiconductor, oxide semiconductor, and/or the like.

The electronic apparatus may further include a sealing portion (e.g., a sealing unit) that seals the light-emitting device 10A. The sealing portion may be located between the color filter and/or color conversion layer and the light-emitting device 10A. The sealing portion allows light from the light-emitting device 10A to be extracted to the outside, and concurrently or simultaneously prevents or reduces ambient air and/or moisture from penetrating into the light-emitting device 10A. The sealing portion may be a sealing substrate including a transparent glass substrate and/or a plastic substrate. The sealing portion may be a thin-film encapsulation layer including at least one layer of an organic layer and/or an inorganic layer. When the sealing portion is a thin film encapsulation layer, the electronic apparatus may be flexible.

Various suitable functional layers, in addition to the color filter and/or the color conversion layer, may be additionally located on the sealing portion according to the usage of the electronic apparatus. The functional layers may include a touch screen layer, a polarizing layer, and/or the like. The touch screen layer may be a pressure-sensitive touch screen layer, a capacitive touch screen layer, or an infrared touch screen layer. The authentication apparatus may be, for example, a biometric authentication apparatus that authenticates an individual by utilizing biometric information of living matter (for example, fingertips, pupils, etc.).

The authentication apparatus may further include, in addition to the organic light-emitting device 10A, a biometric information collector.

The electronic apparatus may be applied to various suitable displays, light sources, lighting, personal computers (for example, a mobile personal computer), mobile phones, digital cameras, electronic organizers, electronic dictionaries, electronic game machines, medical instruments (for example, electronic thermometers, sphygmomanometers, blood glucose meters, pulse measurement devices, pulse wave measurement devices, electrocardiogram displays, ultrasonic diagnostic devices, and/or endoscope displays), fish finders, various suitable measuring instruments, meters (for example, meters for a vehicle, an aircraft, and/or a vessel), projectors, and/or the like.

Definition of Terms

The term "$C_3$-$C_{60}$ carbocyclic group" as used herein refers to a cyclic group including only 3-60 carbon atoms as ring-forming atoms, and the term "$C_1$-$C_{60}$ heterocyclic group" as used herein refers to a cyclic group that includes, in addition to 1-60 carbon atoms, a heteroatom as ring-forming atoms. The $C_3$-$C_{60}$ carbocyclic group and the $C_1$-$C_{60}$ heterocyclic group may each be a monocyclic group consisting of one ring or a polycyclic group in which two or more rings are condensed with each other. For example, the $C_1$-$C_{60}$ heterocyclic group may have 3 to 61 ring-forming atoms.

The term "cyclic group" as used herein may include the $C_3$-$C_{60}$ carbocyclic group and the $C_1$-$C_{60}$ heterocyclic group.

The term "π electron-rich $C_3$-$C_{60}$ cyclic group" as used herein refers to a cyclic group that has 3-60 carbon atoms, and does not include (e.g., excluding) *—N=*' as a ring-forming moiety, and the term "π electron-deficient nitrogen-containing $C_1$-$C_{60}$ cyclic group" as used herein refers to a heterocyclic group that has 1-60 carbon atoms and includes *—N=*' as a ring-forming moiety.

For example,
the $C_3$-$C_{60}$ carbocyclic group may be i) a T1 group or ii) a condensed cyclic group in which at least two T1 groups are condensed with (e.g., combined together with) each other (for example, the $C_3$-$C_{60}$ carbocyclic group may be a cyclopentadiene group, an adamantane group, a norbornane group, a benzene group, a pentalene group, a naphthalene group, an azulene group, an indacene group, an acenaphthylene group, a phenalene group, a phenanthrene group, an anthracene group, a fluoranthene group, a triphenylene group, a pyrene group, a chrysene group, a perylene group, a pentaphene group, a heptalene group, a naphthacene group, a picene group, a hexacene group, a pentacene group, a rubicene group, a coronene group, an ovalene group, an indene group, a fluorene group, a spiro-bifluorene group, a benzofluorene group, an indenophenanthrene group, or an indenoanthracene group),
the $C_1$-$C_{60}$ heterocyclic group may be i) a T2 group, ii) a condensed cyclic group in which at least two T2 groups are condensed with (e.g., combined together with) each other, or iii) a condensed cyclic group in which at least one T2 group and at least one T1 group are condensed with (e.g., combined together with) each other (for example, the $C_1$-$C_{60}$ heterocyclic group may be a pyrrole group, a thiophene group, a furan group, an indole group, a benzoindole group, a naphthoindole group, an isoindole group, a benzoisoindole group, a naphthoisoindole group, a benzosilole group, a benzothiophene group, a benzofuran group, a carbazole group, a dibenzosilole group, a dibenzothiophene group, a dibenzofuran group, an indenocarbazole group, an indolocarbazole group, a benzofurocarbazole group, a benzothienocarbazole group, a benzosilolocarbazole group, a benzoindolocarbazole group, a benzocarbazole group, a benzonaphthofuran group, a benzonaphthothiophene group, a benzonaphthosilole group, a benzofurodibenzofuran group, a benzofurodibenzothiophene group, a benzothienodibenzothiophene group, a pyrazole group, an imidazole group, a triazole group, an oxazole group, an isoxazole group, an oxadiazole group, a thiazole group, an isothiazole group, a thiadiazole group, a benzopyrazole group, a benzimidazole group, a benzoxazole group, a benzoisoxazole group, a benzothiazole group, a benzoisothiazole group, a pyridine group, a pyrimidine group, a pyrazine group, a pyridazine group, a triazine group, a quinoline group, an isoquinoline group, a benzoquinoline group, a benzoisoquinoline group, a quinoxaline group, a benzoquinoxaline group, a quinazoline group, a benzoquinazoline group, a phenanthroline group, a cinnoline group, a phthalazine group, a naphthyridine group, an imidazopyridine group, an imidazopyrimidine group, an imidazotriazine group, an imidazopyrazine group, an imidazopyridazine group, an azacarbazole group, an azafluorene group, an azadibenzosilole group, an azadibenzothiophene group, an azadibenzofuran group, etc.), the π electron-rich $C_3$-$C_{60}$ cyclic group may be i) a T1 group, ii) a condensed cyclic group in which at least two T1 groups are condensed with (e.g., combined together with) each other, iii) a T3 group, iv) a condensed cyclic group in which at least two T3 groups are condensed with (e.g., combined together with) each other, or v) a condensed cyclic group in which at least one T3 group and at least one T1 group are condensed with (e.g., combined together with) each other (for example, the π electron-rich $C_3$-$C_{60}$ cyclic group may be the $C_3$-$C_{60}$ carbocyclic group, a 1H-pyrrole group, a silole group, a borole group, a 2H-pyrrole group, a 3H-pyrrole group, a thiophene group, a furan group, an indole group, a benzoindole group, a naphthoindole group, an isoindole group, a benzoisoindole group, a naphthoisoindole group, a benzosilole group, a benzothiophene group, a benzofuran group, a carbazole group, a dibenzosilole group, a dibenzothiophene group, a dibenzofuran group, an indenocarbazole group, an indolocarbazole group, a benzofurocarbazole group, a benzothienocarbazole group, a benzosilolocarbazole group, a benzoindolocarbazole group, a benzocarbazole group, a benzonaphthofuran group, a benzonaphthothiophene group, a benzonaphthosilole group, a benzofurodibenzofuran group, a benzofurodibenzothiophene group, a benzothienodibenzothiophene group, etc.), the π electron-deficient nitrogen-containing $C_1$-$C_{60}$ cyclic group may be i) a T4 group, ii) a condensed cyclic group in which at least two T4 groups are condensed with (e.g., combined together with each other) each other, iii) a condensed cyclic group in which at least one T4 group and at least one T1 group are condensed with (e.g., combined together with each other) each other, iv) a condensed cyclic group in which at least one T4 group and at least one T3 group are condensed with (e.g., combined together with each other) each other, or v) a condensed cyclic group in which at least one T4 group, at least one T1 group, and at least one T3 group are condensed with (e.g., combined together with each other) one another (for example, the π electron-deficient nitrogen-containing $C_1$-$C_{60}$ cyclic group may be a pyrazole group, an imidazole group, a triazole group, an oxazole group, an isoxazole group, an oxadiazole group, a thiazole group, an isothiazole group, a thiadiazole group, a benzopyrazole group, a benzimidazole group, a benzoxazole group, a benzoisoxazole group, a benzothiazole group, a benzoisothiazole group, a pyridine group, a pyrimidine group, a pyrazine group, a pyridazine group, a triazine group, a quinoline group, an isoquinoline group, a benzoquinoline group, a benzoisoquinoline group, a quinoxaline group, a benzoquinoxaline group, a quinazoline group, a benzoquinazoline group, a phenanthroline group, a cinnoline group, a phthalazine group, a naphthyridine group, an imidazopyridine group, an imidazopyrimidine group, an imidazotriazine group, an imidazopyrazine group, an imidazopyridazine group, an azacarbazole group, an azafluorene group, an azadibenzosilole group, an azadibenzothiophene group, an azadibenzofuran group, etc.), the T1 group may be a cyclopropane group, a cyclobutane group, a cyclopentane group, a cyclohexane group, a cycloheptane group, a cyclooctane group, a cyclobutene group, a cyclopentene group, a cyclopentadiene group, a cyclohexene group, a cyclohexadiene group, a cycloheptene group, an adamantane group, a norbornane (or a bicyclo[2.2.1]heptane) group, a norbornene group, a bicyclo[1.1.1]pentane group, a bicyclo[2.1.1]hexane group, a bicyclo[2.2.2]octane group, or a benzene group, the T2 group may be a furan group, a thiophene group, a 1H-pyrrole group, a silole group, a borole group, a 2H-pyrrole group, a 3H-pyrrole group, an imidazole group, a pyrazole group, a triazole group, a tetrazole group, an oxazole group, an isoxazole group, an oxadiazole group, a thiazole group, an isothiazole group, a thiadiazole group, an azasilole group, an azaborole group, a pyridine group, a pyrimidine group, a pyrazine group, a pyridazine group, a triazine group, a tetrazine group, a pyrrolidine group, an imidazolidine group, a dihydropyrrole group, a piperidine group, a tetrahydropyridine group, a dihydropyridine group, a hexahydropyrimidine group, a tetrahydropyrimidine group, a dihydropyrimidine group, a piperazine group, a tetrahydropyrazine group, a dihydropyrazine group, a tetrahydropyridazine group, or a dihydropyridazine group, the T3 group may be a furan group, a thiophene group, a 1H-pyrrole group, a silole group, or a borole group, and the T4 group may be a 2H-pyrrole group, a 3H-pyrrole group, an imidazole group, a pyrazole group, a triazole group, a tetrazole group, an oxazole group, an isoxazole group, an oxadiazole group, a thiazole group, an isothiazole group, a thiadiazole group, an azasilole group, an azaborole group, a pyridine group, a pyrimidine group, a pyrazine group, a pyridazine group, a triazine group, or a tetrazine group.

The terms "the cyclic group," "the $C_3$-$C_{60}$ carbocyclic group," "the $C_1$-$C_{60}$ heterocyclic group," "the π electron-rich $C_3$-$C_{60}$ cyclic group," or "the π electron-deficient nitrogen-containing $C_1$-$C_{60}$ cyclic group" as used herein refer to a group condensed with any cyclic group, a monovalent group, or a polyvalent group (for example, a divalent group, a trivalent group, a tetravalent group, etc.), depending on the structure of a formula in connection with which the terms are used. In one or more embodiments, "a benzene group" may be a benzo group, a phenyl group, a phenylene group, and/or the like, which may be easily understood by one of ordinary skill in the art according to the structure of a formula including the "benzene group."

Examples of the monovalent $C_3$-$C_{60}$ carbocyclic group and the monovalent $C_1$-$C_{60}$ heterocyclic group may include (e.g., may be) a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_1$-$C_{60}$ heteroaryl group, a monovalent non-aromatic condensed polycyclic group, and a monovalent non-aromatic condensed heteropolycyclic group, and examples of the divalent $C_3$-$C_{60}$ carbocyclic group and the divalent $C_1$-$C_{60}$ heterocyclic group may include (e.g., may be) a $C_3$-$C_{10}$ cycloalkylene group, a $C_1$-$C_{10}$ heterocycloalkylene group, a $C_3$-$C_{10}$ cycloalkenylene group, a $C_1$-$C_{10}$ heterocycloalkenylene group, a $C_6$-$C_{60}$ arylene group, a $C_1$-$C_{60}$ heteroarylene group, a divalent non-aromatic condensed polycyclic group, and a divalent non-aromatic condensed heteropolycyclic group.

The term "$C_1$-$C_{60}$ alkyl group" as used herein refers to a linear or branched aliphatic hydrocarbon monovalent group that has one to sixty carbon atoms, and examples thereof may include (e.g., may be) a methyl group, an ethyl group, an n-propyl group, an isopropyl group, an n-butyl group, a sec-butyl group, an isobutyl group, a tert-butyl group, an n-pentyl group, a tert-pentyl group, a neopentyl group, an isopentyl group, a sec-pentyl group, a 3-pentyl group, a sec-isopentyl group, an n-hexyl group, an isohexyl group, a sec-hexyl group, a tert-hexyl group, an n-heptyl group, an isoheptyl group, a sec-heptyl group, a tert-heptyl group, an n-octyl group, an isooctyl group, a sec-octyl group, a tert-octyl group, an n-nonyl group, an iso-nonyl group, a sec-nonyl group, a tert-nonyl group, an n-decyl group, an isodecyl group, a sec-decyl group, and a tert-decyl group. The term "$C_1$-$C_{60}$ alkylene group" as used herein refers to a divalent group having the same structure as the $C_1$-$C_{60}$ alkyl group.

The term "$C_2$-$C_{60}$ alkenyl group" as used herein refers to a monovalent hydrocarbon group having at least one carbon-carbon double bond at a main chain (e.g., in the middle) or at a terminal end (e.g., the terminus) of a $C_2$-$C_{60}$ alkyl group, and examples thereof may include (e.g., may be) an ethenyl group, a propenyl group, and a butenyl group. The term "$C_2$-$C_{60}$ alkenylene group" as used herein refers to a divalent group having the same structure as the $C_2$-$C_{60}$ alkenyl group.

The term "$C_2$-$C_{60}$ alkynyl group" as used herein refers to a monovalent hydrocarbon group having at least one carbon-carbon triple bond at a main chain (e.g., in the middle) or at a terminal end (e.g., the terminus) of a $C_2$-$C_{60}$ alkyl group, and examples thereof may include an ethynyl group, and a propynyl group. The term "$C_2$-$C_{60}$ alkynylene group" as used herein refers to a divalent group having the same structure as the $C_2$-$C_{60}$ alkynyl group.

The term "$C_1$-$C_{60}$ alkoxy group" as used herein refers to a monovalent group represented by —$OA_{101}$ (wherein Ani is the $C_1$-$C_{60}$ alkyl group), and examples thereof may include a methoxy group, an ethoxy group, and an isopropyloxy group.

The term "$C_3$-$C_{10}$ cycloalkyl group" as used herein refers to a monovalent saturated hydrocarbon cyclic group having three to ten carbon atoms, and examples thereof may include (e.g., may be) a cyclopropyl group, a cyclobutyl group, a cyclopentyl group, a cyclohexyl group, a cycloheptyl group, a cyclooctyl group, an adamantanyl group, a norbornanyl group (or a bicyclo[2.2.1]heptyl group), a bicyclo[1.1.1]pentyl group, a bicyclo[2.1.1]hexyl group, and a bicyclo[2.2.2]octyl group. The term "$C_3$-$C_{10}$ cycloalkylene group" as used herein refers to a divalent group having the same structure as the $C_3$-$C_{10}$ cycloalkyl group.

The term "$C_1$-$C_{10}$ heterocycloalkyl group" as used herein refers to a monovalent cyclic group that further includes, in addition to a carbon atom, at least one heteroatom as a ring-forming atom and has one to ten carbon atoms, and examples thereof may include (e.g., may be) a 1,2,3,4-oxatriazolidinyl group, a tetrahydrofuranyl group, and a tetrahydrothiophenyl group. The term "$C_1$-$C_{10}$ heterocycloalkylene group" as used herein refers to a divalent group having the same structure as the $C_1$-$C_{10}$ heterocycloalkyl group.

The term "$C_3$-$C_{10}$ cycloalkenyl group" as used herein refers to a monovalent cyclic group that has three to ten carbon atoms and at least one carbon-carbon double bond in the ring thereof and no aromaticity (e.g., is not aromatic), and examples thereof may include (e.g., may be) a cyclopentenyl group, a cyclohexenyl group, and a cycloheptenyl group. The term "$C_3$-$C_{10}$ cycloalkenylene group" as used herein refers to a divalent group having the same structure as the $C_3$-$C_{10}$ cycloalkenyl group.

The term "$C_1$-$C_{10}$ heterocycloalkenyl group" as used herein refers to a monovalent cyclic group that has, in addition to a carbon atom, at least one heteroatom as a ring-forming atom, one to ten carbon atoms, and at least one carbon-carbon double bond in the cyclic structure thereof. Examples of the $C_1$-$C_{10}$ heterocycloalkenyl group may include a 4,5-dihydro-1,2,3,4-oxatriazolylgroup, a 2,3-dihydrofuranyl group, and a 2,3-dihydrothiophenyl group. The term "$C_1$-$C_{10}$ heterocycloalkenylene group" as used herein refers to a divalent group having the same structure as the $C_1$-$C_{10}$ heterocycloalkenyl group.

The term "$C_6$-$C_{60}$ aryl group" as used herein refers to a monovalent group having a carbocyclic aromatic system having six to sixty carbon atoms, and the term "$C_6$-$C_{60}$ arylene group" as used herein refers to a divalent group having a carbocyclic aromatic system having six to sixty carbon atoms. Examples of the $C_6$-$C_{60}$ aryl group may include (e.g., may be) a phenyl group, a pentalenyl group, a naphthyl group, an azulenyl group, an indacenyl group, an acenaphthyl group, a phenalenyl group, a phenanthrenyl group, an anthracenyl group, a fluoranthenyl group, a triphenylenyl group, a pyrenyl group, a chrysenyl group, a perylenyl group, a pentaphenyl group, a heptalenyl group, a naphthacenyl group, a picenyl group, a hexacenyl group, a pentacenyl group, a rubicenyl group, a coronenyl group, and an ovalenyl group. When the $C_6$-$C_{60}$ aryl group and the $C_6$-$C_{60}$ arylene group each include two or more rings, the two or more rings may be condensed with each other.

The term "$C_1$-$C_{60}$ heteroaryl group" as used herein refers to a monovalent group having a heterocyclic aromatic system that has, in addition to 1 to 60 carbon atoms, at least one heteroatom as a ring-forming atom. The term "$C_1$-$C_{60}$ heteroarylene group" as used herein refers to a divalent group having a heterocyclic aromatic system that has, in addition to one to sixty carbon atoms, at least one heteroatom as a ring-forming atom. Examples of the $C_1$-$C_{60}$ heteroaryl group may include (e.g., may be) a carbozylyl group, a pyridinyl group, a pyrimidinyl group, a pyrazinyl group, a pyridazinyl group, a triazinyl group, a quinolinyl group, a benzoquinolinyl group, an isoquinolinyl group, a benzoisoquinolinyl group, a quinoxalinyl group, a benzoquinoxalinyl group, a quinazolinyl group, a benzoquinazolinyl group, a cinnolinyl group, a phenanthrolinyl group, a phthalazinyl group, a dibenzofuranyl group, a dibenzothiofuranyl group, and a naphthyridinyl group. When the $C_1$-$C_{60}$ heteroaryl group and the $C_1$-$C_{60}$ heteroarylene group each include two or more rings, the two or more rings may be condensed with each other.

The term "monovalent non-aromatic condensed polycyclic group" as used herein refers to a monovalent group (for example, having eight to sixty carbon atoms) having two or more rings condensed with each other, only carbon atoms as ring-forming atoms, and no aromaticity in its entire molecular structure (e.g., the entire molecular structure is not aromatic). Examples of the monovalent non-aromatic condensed polycyclic group may include (e.g., may be) an indenyl group, a fluorenyl group, a spiro-bifluorenyl group, a benzofluorenyl group, an indenophenanthrenyl group, an adamantyl group, and an indenoanthracenyl group. The term "divalent non-aromatic condensed polycyclic group" as used herein refers to a divalent group having the same structure as a monovalent non-aromatic condensed polycyclic group.

The term "monovalent non-aromatic condensed heteropolycyclic group" as used herein refers to a monovalent group having two or more rings condensed with each other, at least one heteroatom other than one to sixty carbon atoms, as a ring-forming atom, and no aromaticity in its entire molecular structure (e.g., the entire molecular structure is not aromatic). Examples of the monovalent non-aromatic condensed heteropolycyclic group may include a pyrrolyl group, a thiophenyl group, a furanyl group, an indolyl group, a benzoindolyl group, a naphtho indolyl group, an isoindolyl group, a benzoisoindolyl group, a naphthoisoindolyl group, a benzosilolyl group, a benzothiophenyl group, a benzofuranyl group, a dibenzosilolyl group, a dibenzothiophenyl group, a dibenzofuranyl group, an azacarbazolyl group, an azafluorenyl group, an azadibenzosilolyl group, an azadibenzothiophenyl group, an azadibenzofuranyl group, a pyrazolyl group, an imidazolyl group, a triazolyl group, a tetrazolyl group, an oxazolyl group, an isoxazolyl group, a thiazolyl group, an isothiazolyl group, an oxadiazolyl group, a thiadiazolyl group, a benzopyrazolyl group, a benzimidazolyl group, a benzoxazolyl group, a benzothiazolyl group, a benzoxadiazolyl group, a benzothiadiazolyl group, an imidazopyridinyl group, an imidazopyrimidinyl group, an imidazotriazinyl group, an imidazopyrazinyl group, an imidazopyridazinyl group, an indenocarbazolyl group, an indolocarbazolyl group, a benzofurocarbazolyl group, a benzothienocarbazolyl group, a benzosilolocarbazolyl group, a benzoindolocarbazolyl group, a benzocarbazolyl group, a benzonaphthofuranyl group, a benzonaphthothiophenyl group, a benzonaphthosilolyl group, a benzofurodibenzofuranyl group, a benzofurodibenzothiophenyl group, an azaadamantyl group, and a benzothienodibenzothiophenyl group. The term "divalent non-aromatic condensed heteropolycyclic group" as used herein refers to a divalent group having the same structure as a monovalent non-aromatic condensed heteropolycyclic group.

The term "$C_6$-$C_{60}$ aryloxy group" as used herein refers to a monovalent group represented by —$OA_{102}$ (wherein $A_{102}$ is the $C_6$-$C_{60}$ aryl group), and the term "$C_6$-$C_{60}$ arylthio group" as used herein refers to a monovalent group represented by —$SA_{103}$ (wherein $A_{103}$ is the $C_6$-$C_{60}$ aryl group).

The term "$C_7$-$C_{60}$ aryl alkyl group" as used herein refers to a monovalent group represented by -$A_{104}A_{105}$ (where $A_{104}$ may be a $C_1$-$C_{54}$ alkylene group, and $A_{105}$ may be a $C_6$-$C_{59}$ aryl group), and the term "$C_2$-$C_{60}$ heteroaryl alkyl group" as used herein refers to a monovalent group represented by -$A_{106}A_{107}$ (where $A_{106}$ may be a $C_1$-$C_{59}$ alkylene group, and $A_{107}$ may be a $C_1$-$C_{50}$ heteroaryl group).

The term "$R_{10a}$" as used herein refers to:
deuterium, —F, —Cl, —Br, —I, a hydroxyl group, a cyano group, or a nitro group,
a $C_1$-$C_{60}$ alkyl group, a $C_2$-$C_{60}$ alkenyl group, a $C_2$-$C_{60}$ alkynyl group, or a $C_1$-$C_{60}$ alkoxy group, each unsubstituted or substituted with deuterium, —F, —Cl, —Br, —I, a hydroxyl group, a cyano group, a nitro group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, a $C_7$-$C_{60}$ aryl alkyl group, a $C_2$-$C_{60}$ heteroaryl alkyl group, —Si($Q_{11}$)($Q_{12}$)($Q_{13}$), —N($Q_{11}$)($Q_{12}$), —B($Q_{11}$)($Q_{12}$), —C(=O)($Q_{11}$), —S(=O)$_2$($Q_{11}$), —P(=O)($Q_{11}$)($Q_{12}$), or any combination thereof
a $C_3$-$C_{60}$ carbocyclic group, a $C_1$-$C_{60}$ heterocyclic group, a $C_6$-$C_{60}$ aryloxy group, a $C_6$-$C_{60}$ arylthio group, a $C_7$-$C_{60}$ aryl alkyl group, or a $C_2$-$C_{60}$ heteroaryl alkyl group, each unsubstituted or substituted with deuterium, —F, —Cl, —Br, —I, a hydroxyl group, a cyano group, a nitro group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, a $C_7$-$C_{60}$ aryl alkyl group, a $C_2$-$C_{60}$ heteroaryl alkyl group, —Si($Q_{21}$)($Q_{22}$)($Q_{23}$), —N($Q_{21}$)($Q_{22}$), —B($Q_{21}$)($Q_{22}$), —C(=O)($Q_{21}$), —S(=O)$_2$($Q_{21}$), —P(=O)($Q_{21}$)($Q_{22}$), or any combination thereof; or
—Si($Q_{31}$)($Q_{32}$)($Q_{33}$), —N($Q_{31}$)($Q_{32}$), —B($Q_{31}$)($Q_{32}$), —C(=O)($Q_{31}$), —S(=O)$_2$($Q_{31}$), or —P(=O)($Q_{31}$)($Q_{32}$).

$Q_1$ to $Q_3$, $Q_{11}$ to $Q_{13}$, $Q_{21}$ to $Q_{23}$, and $Q_{31}$ to $Q_{33}$ used herein may each independently be: hydrogen; deuterium; —F; —Cl; —Br; —I; a hydroxyl group; a cyano group; a nitro group; a $C_1$-$C_{60}$ alkyl group; a $C_2$-$C_{60}$ alkenyl group; a $C_2$-$C_{60}$ alkynyl group; a $C_1$-$C_{60}$ alkoxy group; or a $C_3$-$C_{60}$ carbocyclic group, a $C_1$-$C_{60}$ heterocyclic group, a $C_7$-$C_{60}$ aryl alkyl group, or a $C_2$-$C_{60}$ heteroaryl alkyl group, each unsubstituted or substituted with deuterium, —F, a cyano group, a $C_1$-$C_{60}$ alkyl group, a $C_1$-$C_{60}$ alkoxy group, a phenyl group, a biphenyl group, or any combination thereof.

The term "heteroatom" as used herein refers to any atom other than a carbon atom. Examples of the heteroatom may include (e.g., may be) O, S, N, P, Si, B, Ge, Se, and any combination thereof.

The term "Ph" as used herein refers to a phenyl group, the term "Me" as used herein refers to a methyl group, the term "Et" as used herein refers to an ethyl group, the term "ter-Bu," "tBu," or "But" as used herein refers to a tert-butyl group, and the term "OMe" as used herein refers to a methoxy group.

The term "biphenyl group" as used herein refers to "a phenyl group substituted with a phenyl group." In other words, the "biphenyl group" is a substituted phenyl group having a $C_6$-$C_{60}$ aryl group as a substituent.

The term "terphenyl group" as used herein refers to "a phenyl group substituted with a biphenyl group". In other words, the "terphenyl group" is a substituted phenyl group having, as a substituent, a $C_6$-$C_{60}$ aryl group substituted with a $C_6$-$C_{60}$ aryl group.

* and *' as used herein, unless defined otherwise, each refer to a binding site to a neighboring atom in a corresponding formula or moiety.

Hereinafter, embodiments of the quantum dot preparation method and the quantum dot prepared according to the same will be described in more detail with reference to the following synthesis examples and examples.

EXAMPLES

Synthesis Example 1

[1] 0.4 mmol of indium acetate, 1.2 mmol of lauric acid, and 6 ml of 1-octadecene were put into a first container and maintained under vacuum at 120° C. for 2 hours. Then, after injecting nitrogen gas to replace the atmosphere with nitrogen and increasing the temperature to 200° C., the reactants were maintained under the nitrogen atmosphere for 30 minutes. After cooling down to 120° C., the obtained solution was maintained in a vacuum state for 1 hour.

[2] Separately, 0.2 mmol of zinc stearate and 7 ml of 1-octadecene were put into a second container and maintained at 120° C. for 30 minutes. Then, after injecting nitrogen gas to replace the atmosphere with nitrogen, 3 ml of the solution was taken from the first container and injected into the second container. Then, after increasing the temperature to 300° C. and reacting for 10 minutes, the temperature was cooled down to 120° C. and a vacuum state was maintained for 20 minutes. Then, the temperature was increased to 150° C.

[3] 0.1 mmol of tris(trialkylsilyl)phosphine was injected into the second container and reacted for 5 minutes, followed by increasing the temperature to 240° C. and reacting for 30 minutes. Then, after increasing the temperature to 300° C., the reaction was performed for 30 minutes.

[4] Then, when the temperature of the solution in the reaction flask decreases to room temperature, purification was performed two times or more with acetone and toluene. Then, the solvent was completely dried out to prepare a purified product in powder form (InP QD), which was then dispersed in toluene (utilized as a solvent).

[5] 290 nmol of the powder dispersed in the solvent, 8.1 ml of 1-octadecene, and 0.2 mmol of zinc acetate were put into a third container.

[6] Separately, 10 mmol of zinc acetate, 20 mmol of oleic acid, and 13.7 ml of 1-octadecene were put into a fourth container, and maintained under vacuum at 120° C. for 24 hours. Then, after injecting nitrogen gas to replace the atmosphere with nitrogen, the temperature of the solution (e.g., zinc precursor solution) in the flask was lowered to 100° C.

[7] After 1.6 ml of the zinc precursor solution was taken from the fourth container, put into the third container, and then maintained under vacuum at 120° C. for 30 minutes, nitrogen gas was injected to replace the atmosphere with nitrogen.

[8] 0.2 mL (2M) of TOP-Se and 0.1 mL (2M) of TOP-S were put into the third container, followed by increasing the temperature to 320° C. and reacting for 1 hour. After the temperature of the solution in the flask was cooled down to room temperature, purification was performed three times or more with acetone and toluene. Then, the solvent was completely dried out to prepare a purified product in powder.

Comparative Synthesis Example 1

[1] 0.4 mmol of indium acetate powder, 1.2 mmol of lauric acid powder, and 6 ml of 1-octadecene were put into a first container and maintained under vacuum at 120° C. for 2 hours. Then, after injecting nitrogen gas to replace the atmosphere with nitrogen, the temperature was increased to 200° C. and the reactant was maintained under the nitrogen atmosphere for 30 minutes. After cooling down to 120° C., the obtained solution was maintained in vacuum state for 1 hour.

[2] Separately, 0.2 mmol of zinc stearate and 7 ml of 1-octadecene were put into a second container and maintained under vacuum at 120° C. for 30 minutes. Then, after injecting nitrogen gas to replace the atmosphere with nitrogen, 3 ml of the solution was taken from the first container and injected into the second container. Then, after increasing the temperature to 300° C. and reacting for 10 minutes, the temperature was cooled down to 120° C. and a vacuum state was maintained for 20 minutes. Then, the temperature was increased to 150° C.

[3] 0.1 mmol of tris(trimethylsilyl)phosphine was injected into the second container and reacted for 5 minutes, followed by increasing the temperature to 240° C. and reacting for 30 minutes. Then, after increasing the temperature to 300° C., the reaction was performed for 30 minutes.

[4] Then, when the temperature of the solution in the reaction flask decreased to room temperature, purification was performed two times or more with acetone and toluene. Then, the solvent was completely dried out to prepare a purified product in powder form (InP QD), and then dispersed in toluene (utilized as a solvent).

[5] 290 nmol of the powder dispersed in the solvent, 8.2 ml of 1-octadecene, and 0.2 mmol of zinc acetate were put into a third container.

[6] Separately, 10 mmol of zinc acetate, 20 mmol of oleic acid, and 13.7 ml of 1-octadecene were put into a fourth container, and maintained under vacuum at 120° C. for 24 hours. Then, after injecting nitrogen gas to replace the atmosphere with nitrogen, the temperature of the solution (e.g., zinc precursor solution) in the flask was lowered to 100° C.

[7] 1.6 ml of the zinc precursor solution was taken from the fourth container, put into the third container, and then maintained under vacuum at 120° C. for 30 minutes. Then, nitrogen gas was injected to replace the atmosphere with nitrogen.

[8] 0.2 mL (2M) of TOP-Se was put into the third container, followed by increasing the temperature to 320° C. and reacting for 1 hour. After the temperature of the solution in the flask was cooled down to room temperature, purification was performed three times or more with acetone and toluene. Then, the solvent was completely dried out to prepare a purified product in powder.

Comparative Synthesis Example 2

[1] 0.4 mmol of indium acetate powder, 1.2 mmol of lauric acid powder, and 6 ml of 1-octadecene were put into a first container and maintained under vacuum at 120° C. for 2 hours. Then, after injecting nitrogen gas to replace the atmosphere with nitrogen, the temperature was increased to 200° C. and the reactants were maintained under the nitrogen atmosphere for 30 minutes. After cooling down to 120° C., the obtained solution was maintained in the vacuum state for 1 hour.

[2] Separately, 0.2 mmol of zinc stearate and 7 ml of 1-octadecene were put into a second container and maintained under vacuum at 120° C. for 30 minutes. Then, after injecting nitrogen gas to replace the atmosphere with nitrogen, 3 ml of the solution was taken from the first container and injected into the second container. Then, after increasing the temperature to 300° C. and reacting for 10 minutes, the temperature was cooled down to 120° C. and the vacuum state was maintained for 20 minutes. Then, the temperature was increased to 150° C.

[3] 0.1 mmol of tris(trimethylsilyl)phosphine was injected into the second container and reacted for 5 minutes, followed by increasing the temperature to 240° C. and reacting for 30 minutes. Then, after increasing the temperature to 300° C., the reaction was performed for 30 minutes.

[4] Then, when the temperature of the solution in the reaction flask decreases to room temperature, purification was performed two times or more with acetone and toluene. Then, the solvent was completely dried out to prepare a purified product in powder form (InP QD), and then dispersed in toluene utilized as a solvent.

[5] 290 nmol of the powder dispersed in the solvent, and 7.7 ml of 1-octadecene were put into a third container.

[6] Separately, 10 mmol of zinc acetate, 20 mmol of oleic acid, and 13.7 ml of 1-octadecene were put into a fourth container, and maintained under vacuum at 120° C. for 24 hours. Then, after injecting nitrogen gas to replace the atmosphere with nitrogen, the temperature of the solution (e.g., zinc precursor solution) in the flask was lowered to 100° C.

[7] 2.0 ml of the zinc precursor solution was taken from the fourth container, put into the third container, and then maintained under vacuum at 120° C. for 30 minutes. Then, nitrogen gas was injected to replace the atmosphere with nitrogen.

[8] 0.2 mL (2M) of TOP-Se and 0.1 mL (2M) of TOP-S were put into the third container, followed by increasing the temperature to 320° C. and reacting for 1 hour. After the temperature of the solution in the flask was cooled down to room temperature, purification was performed three times or more with acetone and toluene. Then, the solvent was completely dried out to prepare a purified product in powder.

Evaluation Example 1

Photoluminescence (PL) spectra of the quantum dots according to Synthesis Example 1, Comparative Synthesis Example 1, and Comparative Synthesis Example 2 were measured utilizing an Otsuka QE-2100 system.

Figure 4:
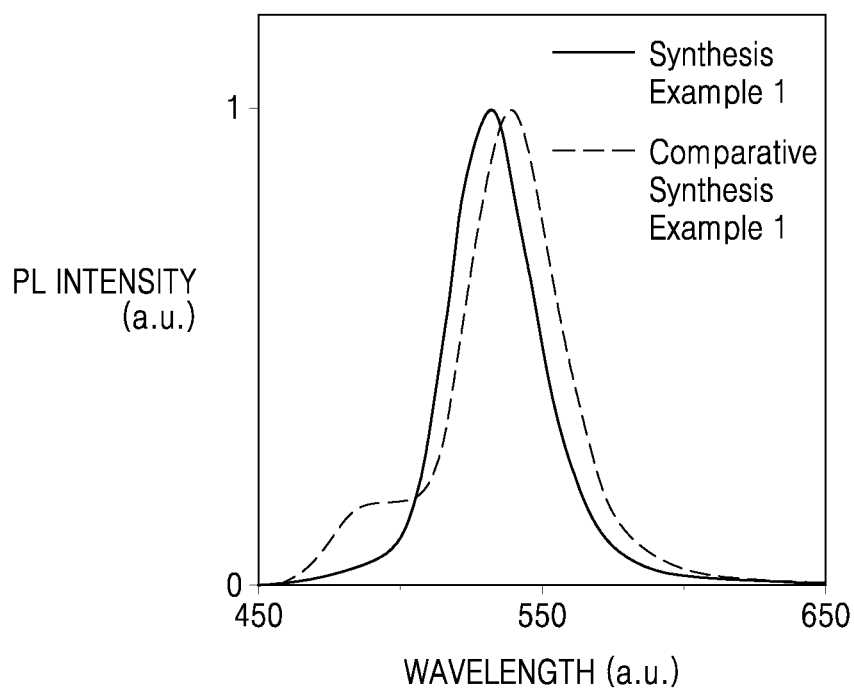
FIGS. 4 and 5 illustrate photoluminescence (PL) spectra of quantum dots according to Synthesis Example 1 and Comparative Synthesis Examples 1 or 2 respectively.
Figure 5:
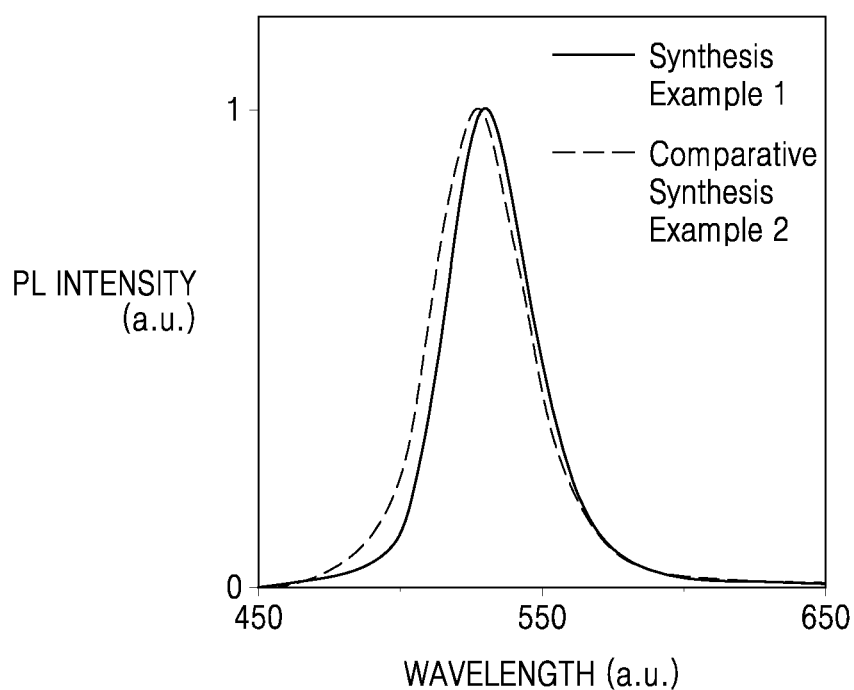

The PL spectra of the quantum dots according to Synthesis Example 1, Comparative Synthesis Example 1, and Comparative Synthesis Example 2, measured according to the above-described evaluation method, are shown in FIGS. 4 and 5. The full width at half maximum (FWHM) values and PL peaks of the quantum dots are shown in Table 1.

TABLE 1

|  | Synthesis Example 1 | Comparative Synthesis Example 1 | Comparative Synthesis Example 2 |
| --- | --- | --- | --- |
| FWHM (nm) | 35 | 38 | 38 |
| Presence of parasitic peak | No | Yes | No |
| PL peak (nm) | 531 | 539 | 528 |

Referring to Table 1, it was found that the FWHM of the quantum dot according to Synthesis Example 1 was narrower than the FWHW of the quantum dot according to Comparative Synthesis Examples 1 and 2.

Example 1

A glass substrate with, as an anode, an ITO electrode deposited thereon was cut to a size of 50 mm×50 mm×0.7 mm, ultrasonically cleaned with isopropyl alcohol and pure water, each for 5 minutes, and then cleaned by exposure to ultraviolet rays and ozone for 30 minutes. Then, the glass substrate was loaded into a vacuum deposition apparatus.

PEDOT:PSS was spin-coated on the ITO electrode and dried to form a hole injection layer having a thickness of 40 nm, and then, TFB was spin-coated on the hole injection layer to form a hole transport layer having a thickness of 40 nm.

A composition including the quantum dot of Synthesis Example 1 was spin-coated on the hole transport layer at a coating rate of 3,500 rpm for 30 seconds, and dried naturally at room temperature for 5 minutes, and then further dried at 100° C. for 10 minutes to form an emission layer having a thickness of 15 nm.

After a composition of mixture of 0.1 g of electron transport particles (ZnMgO) with 10 mL of cyclohexylbenzene was coated on the emission layer by utilizing an inkjet printer, and then dried naturally to form an electron transport layer having a thickness of 40 nm, Ag was deposited on the electron transport layer to form a cathode having a thickness of 150 nm, thereby manufacturing a light-emitting device.

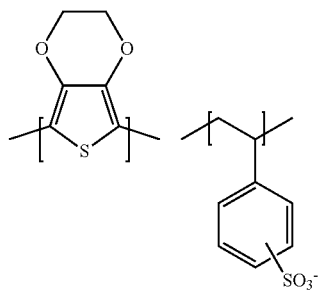

<PEDOT:PSS>

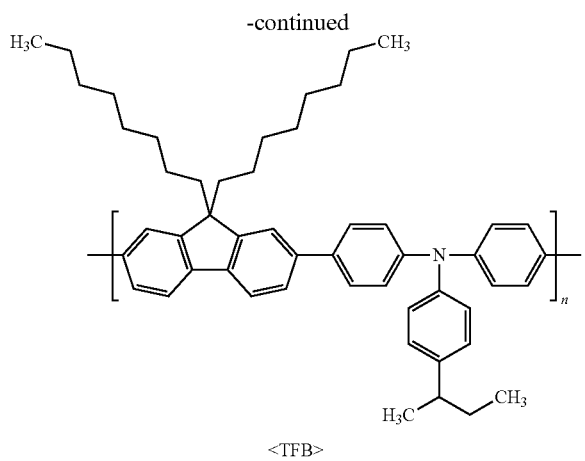

<TFB>

Comparative Example 1

A light-emitting device was manufactured in the same manner as in Example 1, except that the quantum dot of Comparative Synthesis Example 2 was utilized instead of the quantum dot of Synthesis Example 1.

Evaluation Example 2

The luminescence efficiencies (cd/A) of the light-emitting devices of Example 1 and Comparative Example 1, and the emission wavelength and FWHM in the electroluminescence spectrum thereof were measured utilizing a Keithley SMU 236 and a luminance meter PR650 respectively. The results are represented as relative values (%) in Table 2.

Figure 6:
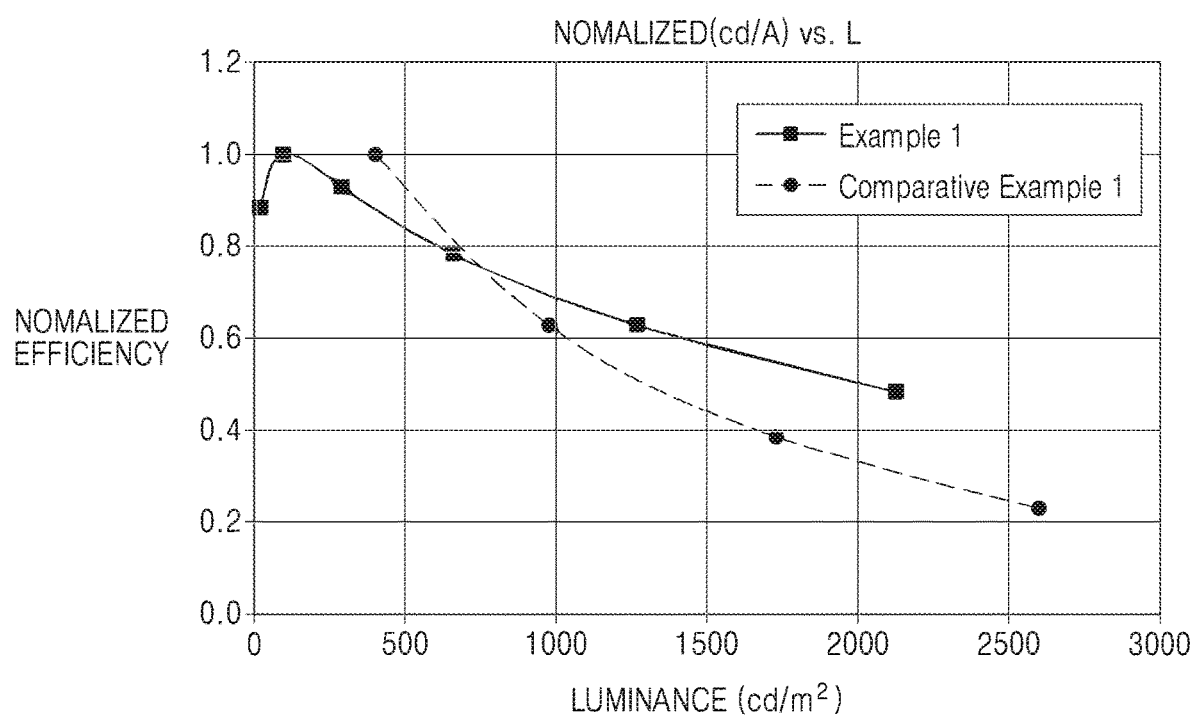
FIG. 6 illustrates luminescence efficiencies of light-emitting devices according to Example 1 and Comparative Example 1.
Figure 7:
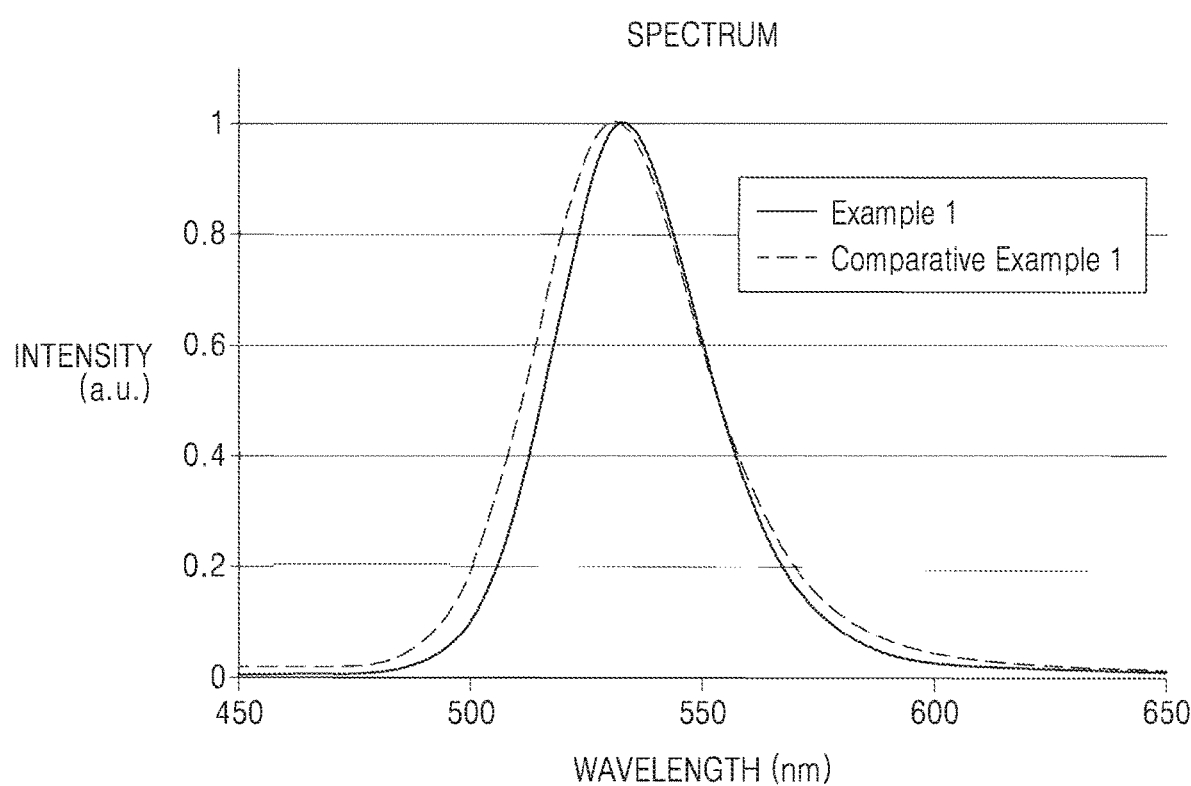
FIG. 7 illustrates electroluminescence (EL) spectra of the light-emitting devices according to Example 1 and Comparative Example 1.

Luminescence efficiencies with respect to luminance of the light-emitting devices according to Example 1 and Comparative Example 1 are shown in FIG. 6. Electroluminescence spectra of the light-emitting devices according to Example 1 and Comparative Example 1 are shown in FIG. 7.

TABLE 2

| | Quantum dot | Quantum dot structure | Presence of zinc acetate | Electroluminescence Wavelength (nm) | Electroluminescence FWHM (nm) | Luminesence efficiency |
|---|---|---|---|---|---|---|
| Example 1 | Synthesis Example 1 | InP/ZnSes | Yes | 533 | 38 | 140 |
| Comparative Example 1 | Comparative Synthesis Example 2 | InP/ZnSes | No | 531 | 41 | 100 |

Referring to Table 2, it was found that the light-emitting device according to Example 1 had improved luminescence efficiency as compared with the light-emitting device according to Comparative Example 1.

As described above, according to the one or more embodiments, quantum dots prepared utilizing the quantum dot preparation method according to the embodiments exhibit a narrow FWHM and excellent color purity, and a high-definition optical member and electronic apparatus can be provided by utilizing the quantum dots.

Expressions such as "at least one of," when preceding a list of elements, modify the entire list of elements and do not modify the individual elements of the list. Further, the use of "may" when describing embodiments of the inventive concept refers to "one or more embodiments of the inventive concept."

As used herein, the terms "substantially," "about," and similar terms are used as terms of approximation and not as terms of degree, and are intended to account for the inherent deviations in measured or calculated values that would be recognized by those of ordinary skill in the art. Also, any numerical range recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims, and equivalents thereof.

What is claimed is:

1. A method of preparing a quantum dot, the method comprising:
preparing a mixture by mixing together a semiconductor compound comprising indium (In), a first precursor comprising a first metal element, a second precursor comprising a second metal element, a third precursor comprising a third element, and a fourth precursor comprising a fourth element; and
heating the mixture,
wherein
the first precursor and the second precursor are different from each other,
the third element and the fourth element are different from each other, and
the heating of the mixture comprises:
a first heating performed at about 120° C. to about 280° C.; and
a second heating performed at about 280° C. to about 340° C., wherein a rate of temperature increase in the first heating is faster than a rate of temperature increase in the second heating.

2. The method of claim 1, wherein the semiconductor compound comprising indium (In) comprises InP.

3. The method of claim 1, wherein the first precursor and the second precursor each independently comprise at least one selected from the group consisting of: dimethyl zinc, diethyl zinc, zinc acetate, zinc acetylacetonate, zinc oleate, zinc stearate, zinc iodide, zinc bromide, zinc chloride, zinc fluoride, zinc carbonate, zinc cyanide, zinc nitrate, zinc oxide, zinc peroxide, zinc perchlorate, zinc sulfate, and any combination thereof.

4. The method of claim 1, wherein the first precursor and the second precursor each independently comprise at least one selected from the group consisting of zinc acetate, zinc acetylacetonate, zinc oleate, and zinc stearate.

5. The method of claim 1, wherein the first precursor comprises zinc oleate, and the second precursor comprises zinc acetate.

6. The method of claim 1, wherein
the first precursor and the second precursor each independently comprise at least one selected from the group consisting of a $C_1$-$C_{60}$ alkyl group unsubstituted or substituted with at least one $R_{10a}$, a $C_2$-$C_{60}$ alkenyl group unsubstituted or substituted with at least one $R_{10a}$, and a $C_2$-$C_{60}$ alkynyl group unsubstituted or substituted with at least one $R_{10a}$,
a number of carbon atoms in the first precursor is different from a number of carbon atoms in the second precursor, and
$R_{10a}$ is:
deuterium, —F, —Cl, —Br, —I, a hydroxyl group, a cyano group, or a nitro group;
a $C_1$-$C_{60}$ alkyl group, a $C_2$-$C_{60}$ alkenyl group, a $C_2$-$C_{60}$ alkynyl group, or a $C_1$-$C_{60}$ alkoxy group, each unsubstituted or substituted with deuterium, —F, —Cl, —Br, —I, a hydroxyl group, a cyano group, a nitro group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, —Si($Q_{11}$)($Q_{12}$)($Q_{13}$), —N($Q_{11}$)($Q_{12}$), —B($Q_{11}$)($Q_{12}$), —C(=O)($Q_{11}$), —S(=O)$_2$($Q_{11}$), —P(=O)($Q_{11}$)($Q_{12}$), or any combination thereof;
a $C_3$-$C_{60}$ carbocyclic group, a $C_1$-$C_{60}$ heterocyclic group, a $C_6$-$C_{60}$ aryloxy group, or a $C_6$-$C_{60}$ arylthio group, each unsubstituted or substituted with deuterium, —F, —Cl, —Br, —I, a hydroxyl group, a cyano group, a nitro group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, —Si($Q_{21}$)($Q_{22}$)($Q_{23}$), —N($Q_{21}$)($Q_{22}$), —B($Q_{21}$)($Q_{22}$), —C(=O)($Q_{21}$), —S(=O)$_2$($Q_{21}$), —P(=O)($Q_{21}$)($Q_{22}$), or any combination thereof; or
—Si($Q_{31}$)($Q_{32}$)($Q_{33}$), —N($Q_{31}$)($Q_{32}$), —B($Q_{31}$)($Q_{32}$), —C(=O)($Q_{31}$), —S(=O)$_2$($Q_{31}$), or —P(=O)($Q_{31}$)($Q_{32}$), and
wherein $Q_{11}$ to $Q_{13}$, $Q_{21}$ to $Q_{23}$, and $Q_{31}$ to $Q_{33}$ are each independently: hydrogen; deuterium; —F; —Cl; —Br; —I; a hydroxyl group; a cyano group; a nitro group; a $C_1$-$C_{60}$ alkyl group; a $C_2$-$C_{60}$ alkenyl group; a $C_2$-$C_{60}$ alkynyl group; a $C_1$-$C_{60}$ alkoxy group; or a $C_3$-$C_{60}$ carbocyclic group or a $C_1$-$C_{60}$ heterocyclic group, each unsubstituted or substituted with deuterium, —F, a cyano group, a $C_1$-$C_{60}$ alkyl group, a $C_1$-$C_{60}$ alkoxy group, a phenyl group, a biphenyl group, or any combination thereof.

7. The method of claim 6, wherein
the first precursor comprises a $C_{11}$-$C_{60}$ alkyl group or a $C_{11}$-$C_{60}$ alkenyl group,
the second precursor comprises a $C_1$-$C_{10}$ alkyl group, and
an amount of the first precursor is greater than an amount of the second precursor in the mixture.

8. The method of claim 1, wherein the third precursor comprises at least one selected from the group consisting of tributylphosphine-selenide (TBP-Se), trioctylphosphine-selenide (TOP-Se), and any combination thereof.

9. The method of claim 1, wherein the fourth precursor comprises at least one selected from the group consisting of tributylphosphine-sulfide (TBP-S), trioctylphosphine-sulfide (TOP-S), and any combination thereof.

10. A quantum dot comprising:
a core comprising a semiconductor compound comprising indium (In); and
a shell surrounding the core,
wherein the shell comprises a first region comprising a third element and a fourth element, and a second region comprising the fourth element, and
the quantum dot has a full width at half maximum of a photoluminescence spectrum of 40 nm or less.

11. The quantum dot of claim 10, wherein the semiconductor compound comprising indium (In) comprises InP.

12. The quantum dot of claim 10, wherein the shell comprises at least one selected from the group consisting of CdS, CdSe, CdTe, ZnS, ZnSe, ZnTe, ZnSeS, ZnTeS, GaAs, GaP, GaSb, HgS, HgSe, HgTe, InAs, InP, InGaP, InSb, AlAs, AlP, AlSb, and any combination thereof.

13. The quantum dot of claim 10, wherein
the first region comprises $ZnSe_xS_{1-x}$ (wherein 0<x<1), and the second region comprises ZnS.

14. The quantum dot of claim 10, wherein the quantum dot has a maximum emission wavelength of a photoluminescence (PL) spectrum of about 520 nm to about 540 nm.

15. An optical member comprising the quantum dot of claim 10.

16. An electronic apparatus comprising the quantum dot of claim 10.

17. The electronic apparatus of claim 16, further comprising:
a light source; and
a color conversion member on a path of light emitted from the light source,
wherein the color conversion member comprises the quantum dot.

18. The electronic apparatus of claim 16, further comprising a light-emitting device comprising a first electrode, a second electrode facing the first electrode, and an emission layer between the first electrode and the second electrode,
wherein the light-emitting device comprises the quantum dot.

* * * * *